(12) United States Patent
Sugita et al.

(10) Patent No.: US 6,538,523 B2
(45) Date of Patent: Mar. 25, 2003

(54) MULTI-CHANNEL PULSE WIDTH MODULATION APPARATUS AND DOWN COUNTER

(75) Inventors: Yukio Sugita, Kanagawa (JP); Shinjiro Toyoda, Suzuka (JP); Takashi Toyoda, Suzuka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/741,104

(22) Filed: Dec. 21, 2000

(65) Prior Publication Data
US 2001/0052827 A1 Dec. 20, 2001

(30) Foreign Application Priority Data

| Dec. 22, 1999 | (JP) | ............................................. 11-363806 |
| Nov. 21, 2000 | (JP) | ....................................... 2000-354480 |
| Jul. 18, 2000 | (JP) | ....................................... 2000-217323 |

(51) Int. Cl.$^7$ ................................................. H03K 7/08
(52) U.S. Cl. ...................... 332/109; 375/238; 327/172; 377/66; 377/94; 377/118
(58) Field of Search ........................ 332/109; 327/172; 377/94, 66, 118; 375/238; 347/235; 348/312

(56) References Cited

U.S. PATENT DOCUMENTS 5,802,187 A * 9/1998 Hsu ........................... 381/119

FOREIGN PATENT DOCUMENTS

JP 9-23145 1/1997 ............ H03K/7/08

* cited by examiner

*Primary Examiner*—Arnold Kinkead
(74) *Attorney, Agent, or Firm*—Sughrue Mion, PLLC

(57) ABSTRACT

When a PWM signal is generated by PWM generators which are provided for the number of channels, each PWM generator outputs the PWM start schedule data showing the timing of startup of the PWM signal to the CPU. When the number of PWM signals which start at substantially the same time exceeds a predetermined number on the basis of the PWM start schedule data, the CPU outputs delay setting data with respect to a channel corresponding to a portion exceeding the predetermined number to the PWM generator as the one showing that the generation of the PWM signal is to be delayed. The PWM generator delays the PWM signal, when the delay setting data shows a delay. As a result, a multi-channel pulse width modulation apparatus which can prevent a decrease in the operational reliability due to simultaneous start of the pulse width modulation signals can be provided.

11 Claims, 24 Drawing Sheets

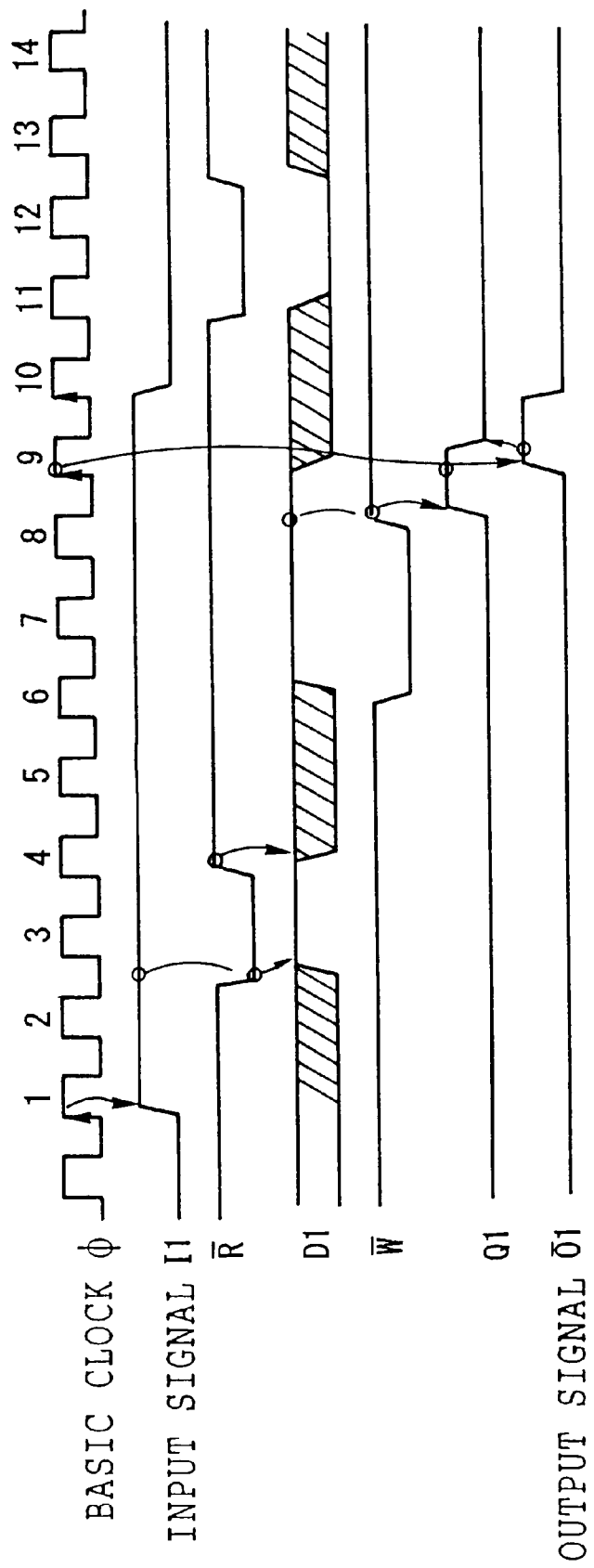

MULTI-CHANNEL PULSE WIDTH MODULATION APPARATUS AND DOWN COUNTER

BACKGROUND OF THE INVENTION

The present invention relates to a multi-channel pulse width modulation apparatus and a down counter, and more specifically, to a multi-channel pulse width modulation apparatus having high operational reliability, and a down counter used for the multi-channel pulse width modulation apparatus.

Conventionally, in order to increase the speed of exposure processing, an image recording apparatus such as a printer or the like which exposes an image on a photosensitive material on the basis of image data, and transfers and outputs onto regular paper the image recorded on the photosensitive material by the exposure, is provided with a plurality of light emission elements such as an LED chip or an LD used for the exposure and performs exposure corresponding to a plurality of pixels at the same time by the plurality of light emission elements.

This type of image recording apparatus controls each light emission of the plurality of light emission elements by an individual pulse width modulation signal (hereinafter, referred to as a "PWM signal"), and the apparatus is generally provided with a multi-channel pulse width modulation apparatus which can generate the same number of PWM signals as that of the light emission elements at the same time.

In a multi-channel pulse width modulation apparatus provided in such an image recording apparatus, either one of the following two methods has been adopted as a setting method of a pulse output timing of each channel, as shown in FIG. 13: a method in which each pulse of the PWM signal is started synchronously to a pixel clock showing one cycle when image recording for one pixel is carried out in a main scanning direction (hereinafter, referred to as an "edge starting output"), and a method in which each pulse is output so that a center of each pulse of the PWM signal is positioned in a vicinity of a central position between each pulse of the pixel clock (hereinafter, referred to as a "center starting output").

In such a multi-channel pulse width modulation apparatus, there has been the problem that sometimes when PWM signals of a plurality of channels start at the same time, a large amount of current flows at the same time into a circuit for generating the PWM signals and the voltage of the power source for supplying the current becomes unstable, whereby operational reliability of the multi-channel pulse width modulation apparatus is considerably deteriorated.

With respect to a multi-channel pulse width modulation apparatus that performs edge starting output, Japanese Patent Application Laid-Open (JP-A) No. 9-23145 discloses as a technology for eliminating the aforementioned problem a technology in which the starting time of each pulse of the PWM signals is fixedly shifted between each channel. However, with respect to a multi-channel pulse width modulation apparatus that performs center starting output, there is no effective technology. In this case, the problem that operational reliability of the multi-channel pulse width modulation apparatus may be considerably deteriorated has been unavoidable.

In other words, in the case of edge starting output, simultaneous starting of the PWM signals of the plurality of channels can be avoided by fixedly shifting the starting time of the PWM signal for each channel by one reference clock, as shown in FIG. 14A.

hence, in the case of center starting output, when the image data corresponding to each PWM signal of, for example, channels 1, 2 and 3 is 2, 2 and 6, respectively, since the image data of channel 1 and channel 2 are equivalent, the start of the PWM signals of channel 1 and channel 2 will be simultaneous in an ordinary center starting output.

Therefore, when the PWM signals are generated so that the center of the pulse of the PWM signal in each channel is shifted between each channel by one standard clock, as shown in FIG. 14B, the start of each PWM signal of channel 1 and channel 2 is shifted by one standard clock, but the start of each PWM signal of channel 1 and channel 3 becomes simultaneous.

When this phenomenon of simultaneous start up occurs in a plurality of channels, the problem that operational reliability may be considerably deteriorated occurs.

SUMMARY OF THE INVENTION

In order to solve the above problem, a first object of the present invention is to provide a multi-channel pulse width modulation apparatus which can prevent a decline in operational reliability resulting from a simultaneous start of pulse width modulation signals, and a second object is to provide an inexpensive down counter which can be used for the multi-channel pulse width modulation apparatus.

In order to achieve the first object, a multi-channel pulse width modulation apparatus according to a first aspect of the present invention comprises: a plurality of pulse width modulation signal generators which respectively generate a pulse width modulation signal, and when a timing signal showing a shifted amount of the generation timing of the pulse width modulation signal is inputted thereto, generate a pulse width modulation signal in which the generation timing thereof is shifted corresponding to the timing signal; and a determination section that determines whether or not the pulse width modulation signals from the plurality of pulse width modulation signal generators exceed a predetermined number and become effective at substantially the same time, and on the basis of the results of the determination, generates the timing signals so that the number of pulse width modulation signals that become effective at substantially the same time becomes no greater than the predetermined number, and outputs the timing signals to a corresponding pulse width modulation signal generation section.

According to the multi-channel pulse width modulation apparatus of the first aspect of the present invention, the pulse width modulation signals are respectively generated by the plurality of pulse width modulation signal generation sections, and when the timing signal showing the shifted amount of each generation timing is inputted, pulse width modulation signals whose generation timing is shifted corresponding to the timing signal are generated.

On the other hand, whether or not the pulse width modulation signals from the plurality of pulse width modulation signal generation sections exceed a predetermined number and become effective at substantially the same time is determined by the determination section. On the basis of the results of the determination, the timing signal is generated so that the number of pulse width modulation signals which become effective at substantially the same time becomes no greater than the predetermined number, and is output to the corresponding pulse width modulation signal generation section. By "become effective" used herein is meant that the pulse width modulation signal "rises" when the pulse width modulation signal is generated in the positive logic, and that the pulse width modulation signal "drops" when the pulse width modulation signal is generated in the negative logic.

Accordingly, the pulse width modulation signals generated respectively by the plurality of pulse width modulation signal generation sections are generated so that the number of pulse width modulation signals that become effective at substantially the same time is no greater than the predetermined number. The predetermined number preferable has as an upper limit a value within a range in which operational reliability of the apparatus is permitted.

In this manner, according to the multi-channel pulse width modulation apparatus of the first aspect of the present invention, whether or not the pulse width modulation signals from the plurality of pulse width modulation signal generation sections exceed a predetermined number and become effective at substantially the same time is determined, and on the basis of the results of the determination, the number of pulse width modulation signals that become effective at substantially the same time is made no greater than the predetermined number. Hence, a decline in operational stability resulting from the pulse width modulation signals becoming effective at substantially the same time can be prevented.

Moreover, the multi-channel pulse width modulation apparatus in a second aspect of the present invention is characterized in that, in the invention of the first aspect, on the basis of the results of the determination, the determination section generates the timing signals so that the pulse width modulation signals do not become effective at substantially the same time and outputs the timing signals to the corresponding pulse width modulation signal generators.

As described above, according to the multi-channel pulse width modulation apparatus of the second aspect of the present invention, the pulse width modulation signals are not made effective at substantially the same time, and hence, it can be reliably prevented that the operational reliability decreases due to the pulse width modulation signals being made effective at substantially the same time.

In this manner, according to the multi-channel pulse width modulation apparatus of the second aspect of the present invention, because the pulse width modulation signals do not become effective at substantially the same time, a decline in operational stability resulting from the pulse width modulation signals becoming effective at substantially the same time can be reliably prevented.

Further, in the multi-channel pulse width modulation apparatus according to a third aspect, the predetermined number is 1.

According to the multi-channel pulse width modulation apparatus of the third aspect, the determination section in the invention of the first aspect determines whether or not the pulse width modulation signals from the plurality of pulse width modulation signal generators exceed 1 and become effective at substantially the same time, and on the basis of the results of the determination, generates the timing signals so that the number of pulse width modulation signals that become effective at substantially the same time becomes no greater than 1, and outputs the timing signals to a corresponding pulse width modulation signal generation section.

In this manner, according to the multi-channel pulse width modulation apparatus of the third aspect, because the plurality of pulse width modulation signals do not become effective at substantially the same time, a decline in operational stability of the apparatus resulting from the pulse width modulation signals becoming effective at substantially the same time can be reliably prevented.

Moreover, in the multi-channel pulse width modulation apparatus according to a fourth aspect, the determination section determines whether or not the time at which the pulse width modulation signals become effective is substantially the same, on the basis of one of: whether or not pulse widths of the pulse width modulation signals that the plurality of pulse width modulation signal generators generate are substantially equivalent; and whether or not scheduled timings indicated by scheduled timing signals are substantially equivalent, with the scheduled timing signals indicating scheduled timings at which the pulse width modulation signals are generated, and being outputted from each pulse width modulation signal generator to the determination section prior to generation of the pulse width modulation signals.

Namely, in the case of center starting output, because the pulse width modulation signals become effective at substantially the same time when the width data values indicating pulse widths of the pulse width modulation signals are substantially equivalent, a determination can be made as to whether or not the pulse width modulation signals become effective at substantially the same time, on the basis of whether or not the width data are equivalent. In this case, because a determination can be made as to whether or not the pulse width modulation signals become effective at substantially the same time without the intervention of the pulse width modulation signal generation section, the determination can be carried out easily and rapidly.

Further, in the pulse width modulation signal generation section, there are many cases in which the timings at which the pulse width modulation signals are generated by the generation section itself are determined in advance. In these cases, each pulse width modulation generator is provided with a function that outputs, prior to the generation of the pulse width modulation signals, to the determination section scheduled timing signals that indicate the scheduled times at which the pulse width modulation signals to be generated are generated. Therefore, on the basis of whether or not the scheduled generation timings indicated by the scheduled timings inputted from each pulse width modulation signal generator are substantially equivalent, the determination section is able to determine whether or not the pulse width modulation signals become effective at substantially the same time. In these cases, because the scheduled timing signals are produced by the pulse width modulation signal generators themselves, the determination section can recognize highly precise scheduled generation timings for the pulse width modulation signals. Consequently, the determination section can determine with high precision whether or not the pulse width modulation signals become effective at substantially the same time.

In this manner, according to the multi-channel pulse width modulation apparatus of the fourth aspect, whether or not the time at which the pulse width modulation signals become effective is substantially the same can be determined on the basis of one of: whether or not pulse widths of the pulse width modulation signals that the plurality of pulse width modulation signal generators generate are substantially equivalent; and whether or not scheduled timings indicated by scheduled timing signals are substantially equivalent, with the scheduled timing signals indicating scheduled timings at which the pulse width modulation signals are generated, and being outputted from each pulse width modulation signal generator to the determination section prior to generation of the pulse width modulation signals. Accordingly, in the former case, determination can be carried out easily and rapidly, and in the latter case, determination can be carried out with high precision.

In order to achieve the first object described above, the multi-channel pulse width modulation apparatus in a fifth aspect of the present invention comprises: a plurality of pulse width modulation signal generators that respectively output a request signal requesting permission to initiate generation of a pulse width modulation signal, and that stop the output of the request signal when an enabling signal indicating permission to initiate generation of the pulse width modulation signal is inputted and initiate generation of the pulse width modulation signal; and an intervening section that outputs enabling signals to corresponding pulse width modulation signal generators when the request signals output from the plurality of pulse width modulation signal generators are inputted and the number of request signals that have become effective at substantially the same time is no greater than a predetermined number, and that outputs enabling signals to a number of pulse width modulation signal generators no greater than the predetermined number when the number of request signals that have become effective at substantially the same time exceeds the predetermined number.

According to the multi-channel pulse width modulation apparatus of the fifth aspect of the present invention, request signals that request permission to start the generation of pulse width modulation signals are respectively output by the plurality of pulse width modulation signal generation sections, and when the enabling signal indicating permission to start the generation of the pulse width modulation signals is inputted, output of the request signal is stopped, whereby generation of the pulse width modulation signals is initiated. When the request signal is output, the request signal may be continuously output or may be repeatedly output for every predetermined time.

In the fifth aspect of the present invention, when the number of request signals that have become effective at substantially the same time is no greater than the predetermined number, enabling signals are output to the pulse width modulation signal generation sections by the meditation portion to which request signals output from the plurality of pulse width modulation signal generation sections are input. When the number of request signals exceeds the predetermined number, the enabling signals are output to a number of pulse width modulation signal generation sections no greater than the predetermined number. By "become effective" used herein is meant that the request signal "rises" when the request signal is generated in the positive logic, and that the request signal "drops" when the request signal is generated in the negative logic.

Therefore, the pulse width modulation signal generated respectively by the plurality of pulse width modulation signal generation sections are generated so that the number of pulse width modulation signals that become effective at substantially the same time becomes no greater than the predetermined number. The predetermined number preferable has as an upper limit a value within a range in which operational reliability of the apparatus is permitted.

In this manner, according to the multi-channel pulse width modulation apparatus of the fifth aspect of the present invention, with regard to the request signals output from the plurality of pulse width modulation signal generation sections, when the number of request signals that have become effective at substantially the same time exceeds the predetermined number, enabling signals indicating permission to start the generation of the pulse width modulation signals are output a number of pulse width modulation signal generation sections no greater than the predetermined numbers. Therefore, the number of pulse width modulation signals that become effective at substantially the same time can be made no greater than the predetermined number. Hence, a decline in operational stability resulting from the pulse width modulation signals becoming effective at substantially the same time can be prevented.

Moreover, the multi-channel pulse width modulation apparatus in a sixth aspect of the present invention is characterized in that, in the invention of the fifth aspect of the present invention, the intervening section outputs the enabling signals in a predetermined order of priority.

At this time, when a plurality of enabling signals is output by the intervening section, the enabling signals are output in the predetermined order of priority. However, when one enabling signal is output by the intervening section, that is, when the predetermined number is 1, the enabling signal is output only to the pulse width modulation signal generation section having the highest priority ranking.

In this manner, according to the multi-channel pulse width modulation apparatus of the sixth aspect of the present invention, because the enabling signals are output in the predetermined order of priority, the pulse width modulation signals may be set so that do not become effective at substantially the same time. Hence, a decline in operational stability resulting from the pulse width modulation signals becoming effective at substantially the same time can be prevented.

It should be noted that the order of priority may be different for each pulse width modulation signal generator, or a same order of priority may also be present.

A multi-channel pulse width modulation apparatus in a seventh aspect of the present invention is characterized in that, in the invention according to the fifth aspect, the pulse width modulation signal generator respectively include: a conversion portion that obtains conversion data in which complement of 1 in the width data indicating a pulse width of a pulse width modulation signal to be generated is shifted to the right by one bit; and a pulse generator that generates the pulse width modulation signal by initiating output of the pulse width modulation signal after an elapse of time corresponding to the conversion data has been calculated and stops output of the pulse width modulation signal after an elapse of time corresponding to the width data has been calculated.

In other words, the output mode of the pulse width modulation signal that is a main object of the present invention is the center starting output (see FIG. 13), and the starting time of the output of the pulse width modulation signal in this case is a point in time in which a time obtained by subtracting the time corresponding to half the pulse width of the pulse width modulation signal from the time corresponding to the half cycle of the pixel clock has elapsed since the generation of the pixel clock.

Here, one cycle of the pixel clock is generally substantially equal to the maximum pulse width of the pulse width modulation signal. In this case, the "time obtained by subtracting the amount of time corresponding to half the pulse width of the pulse width modulation signal from the amount of time corresponding to the half cycle of the pixel clock" can be obtained as conversion data in which complement of 1 in the width data showing the pulse width of the pulse width modulation signal is shifted to the right by 1 bit.

The complement of 1 in the width data at this time can be easily obtained by reversing the value of each bit when the width data is expressed by binary notation, and the above-described right shift by one bit can be easily obtained by using the value of a bit other than the least significant bit. Therefore, the "time obtained by subtracting the amount of time corresponding to half the pulse width of the pulse width modulation signal from the amount of time corresponding to the half cycle of the pixel clock" can be obtained by these operations easily and in a short period of time, compared to a case in which the time is obtained by calculation.

In this manner, according to the multi-channel pulse width modulation apparatus of the seventh aspect of the present invention, an effect similar to that of the fifth or sixth aspect can be obtained. Further, conversion data, in which complement of 1 in the width data indicating the pulse width of the pulse width modulation signal to be generated is shifted to the right by 1 bit, is obtained. Output of the pulse width modulation signals is initiated after the elapse of time corresponding to the conversion data has been calculated. Output of the pulse width modulation signals is stopped after the elapse of time corresponding to the width data has been calculated. Accordingly, the pulse width modulation signals are generated. For this reason, the pulse width modulation signals can be obtained easily and in a short period of time.

In the pulse width modulation signal generation section of the multi-channel pulse width modulation apparatus pertaining to the present invention, because a down counter is necessary for the number of channels when the down counter is used, it is preferable that the structural parts of the down counter are as few as possible. By reducing the number of component parts of the down counter, the apparatus can be made inexpensive, and power consumption and noise can be reduced.

Therefore, it is preferable to use an asynchronous counter having fewer component parts than a synchronous counter as the down counter. However, as shown in FIG. 17 and FIG. 18, the conventional asynchronous counter requires two NAND gates (two AND gates when a D-type flip flop preset terminal PR and a clear terminal CL in these figures are both positive logic) for each circuit structure corresponding to one bit.

Taking this into consideration, the down counter of the present invention comprises: a plurality of edge trigger type flip flops that are tandem connected and that each have a preset terminal and a clear terminal; a preset input terminal connected to all of the preset terminals of said plurality of flip flops; a plurality of two-input AND gates whose output terminals are connected to the clear terminals of said plurality of flip flops; a load signal input terminal connected to all of the one side input terminal of said plurality of AND gates; a plurality of data input terminals connected to the other side input terminal of said AND gates, respectively; and a detection circuit for detecting that values held by said plurality of flip flops become all zero and outputting a detection signal.

It should be noted that this structure is a structure when the clear terminal is a positive logic, and that the AND gate pertaining to the present invention becomes a NAND gate when the clear terminal is a negative logic.

In this manner, according to the down counter of the present invention, a plurality of flip-flop preset terminals included in the down counter are connected to a single preset input terminal, whereby the number of AND gates (or NAND gates) corresponding to preset terminals conventionally required is cut back. As a result, the down counter can be produced inexpensively, and power consumption and noise can be reduced.

BRIEF DESCRIPTION OF THE DRAWINGS

FIG. 14A is a timing chart used for an explanation of a method for avoiding problems in an edge starting output. FIG. 14B is a timing chart used for an explanation of a method for avoiding problems in a center starting output.

FIG. 24 is a timing chart showing an operating state of various signals in a main part of the intervening circuit in FIG. 23.

DETAILED DESCRIPTION OF THE PREFERRED EMBODIMENTS

In the preferred embodiments, description will be given of a case in which a multi-channel pulse width modulation apparatus of the present invention is used as an LED chip emission control portion of an image recording apparatus that controls LED chip emissions on the basis of image data to record an image on photosensitive material.

First Embodiment
(Overall Structure "Appearance")

Figure 1:
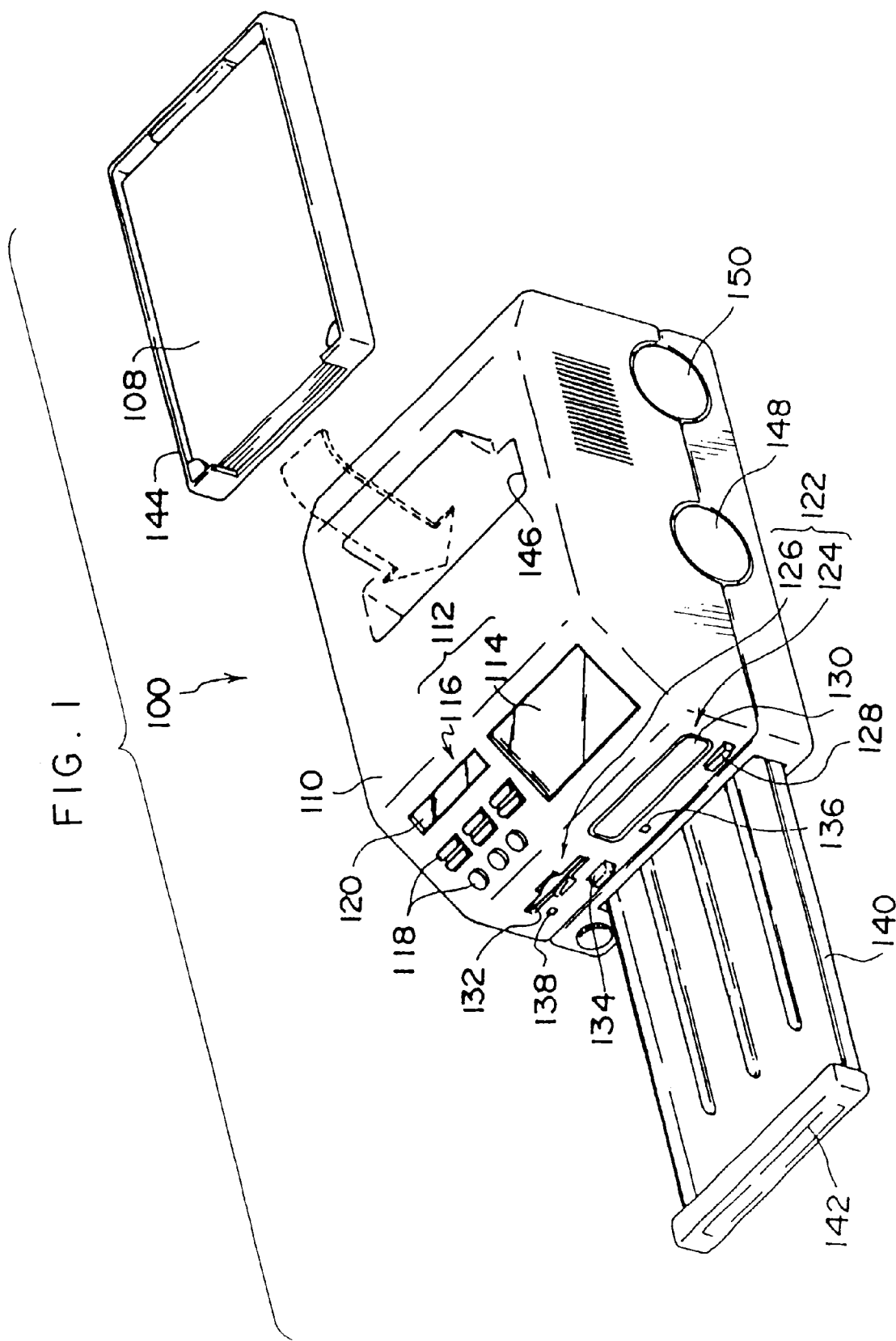
FIG. 1 is a perspective view of an image recording apparatus according to a first embodiment.
Figure 2:
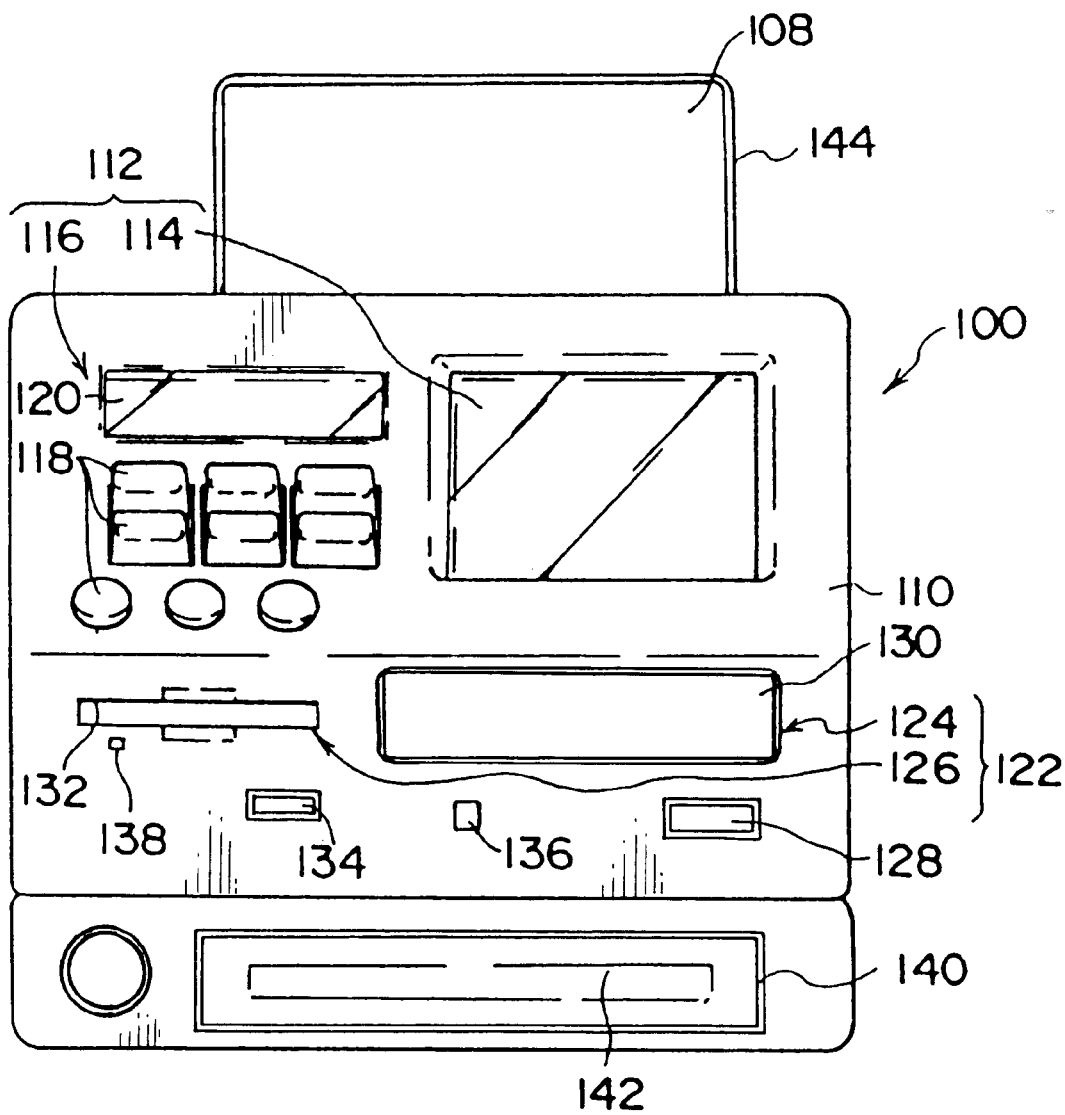
FIG. 2 is an elevational view of the image recording apparatus according to the first embodiment.
Figure 3:
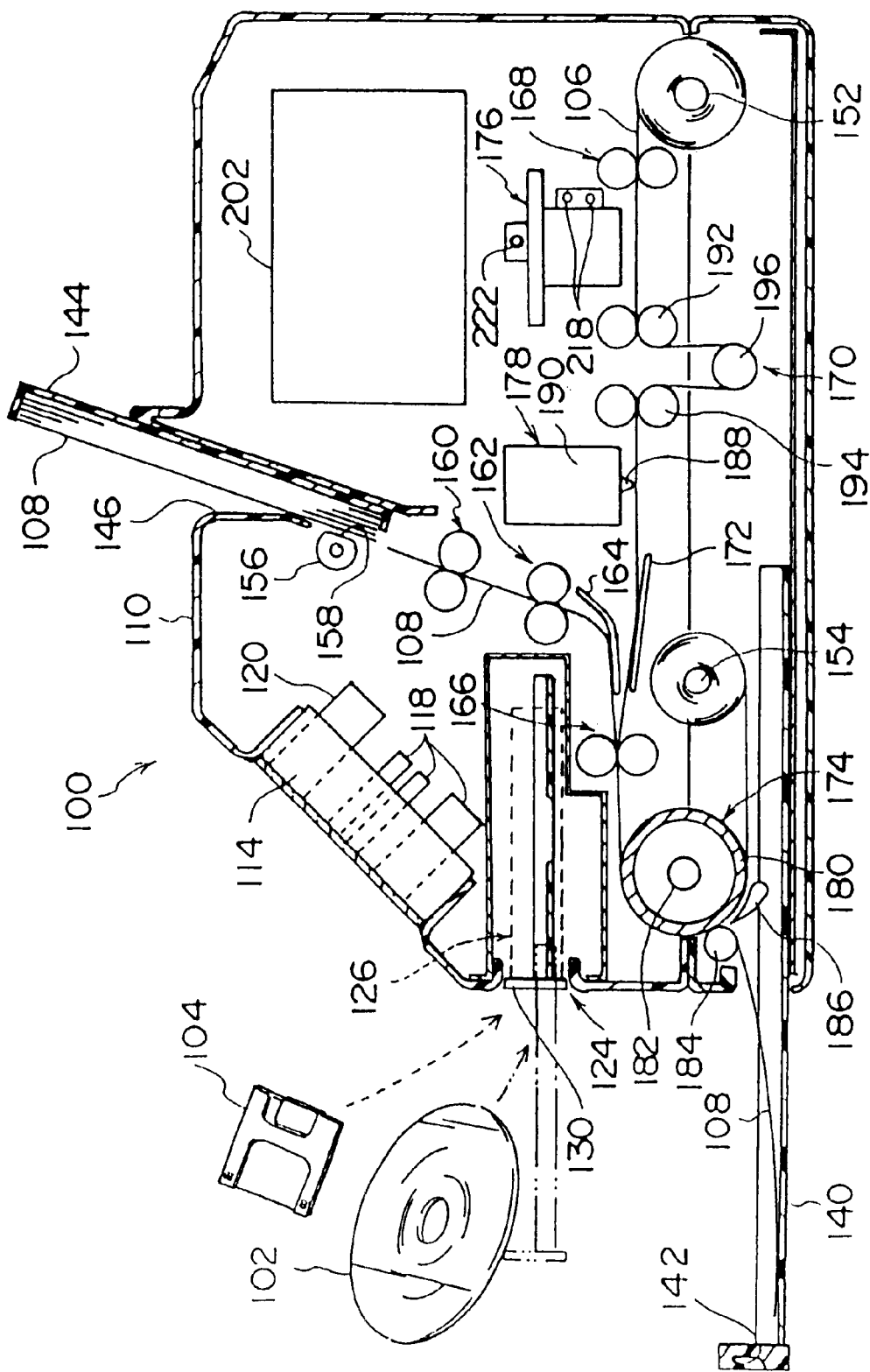
FIG. 3 is a side portional view showing an internal structure of the image recording apparatus according to the first embodiment.

FIG. 1 to FIG. 3 show an image recording apparatus 100 according to the present invention.

The image recording apparatus 100 is an apparatus which reads image data recorded on a CD-ROM 102 or a floppy disk (FD) 104 (see FIG. 3), exposes an image on a photosensitive material 106 on the basis of the image data, and transfers and outputs onto a regular paper (image receiving paper 108) the image recorded on the photosensitive material 106.

An upper part of a front surface (left side in FIG. 3) of a box-shaped casing 110 has an inclined surface, and an operation display portion 112 is provided thereon.

As shown in FIG. 2, the operation display portion 112 is divided into a monitor portion 114 positioned on a right side, and an input portion 116 positioned on a left side. The monitor portion 114 is structured such that the aforesaid read image is transferred thereto.

Moreover, the input portion 116 has a plurality of operation keys 118 and a display portion for input data confirmation 120 so that data necessary for image recording, such as number of sheets to be recorded, size setting, color balance adjustment, negative/positive selection or the like, can be input.

A deck portion 122 is provided at a lower part of the operation display portion 112. The deck portion 122 has a CD-ROM deck portion 124 positioned at a right side thereof and a floppy disc deck portion 126 positioned on the left side.

The CD-ROM deck portion 124 is structured such that a tray 130 can be opened/closed by a pushing operation of an opening/closing button 128. A CD-ROM 102 can be loaded into the inside of the apparatus by mounting the CD-ROM 102 on this tray 130.

The floppy disc deck portion 126 is provided with a floppy disc insertion slot 132. By inserting a floppy disc 104 into the floppy disc insertion slot 132, a drive system inside the apparatus is activated to pull the floppy disc 104 in. When the floppy disc 104 is to be taken out, the floppy disc 104 may be removed by pressing an operation button 134. Access lamps 136 and 138 are respectively provided at the CD-ROM deck portion 124. The access lamps 136 and 138 light up during access.

An ejection tray 140 is disposed below the deck portion 122. The ejection tray 140 is ordinarily housed within the apparatus, and may be extracted by applying a finger to a holding portion 142 (see FIG. 1).

An image receiving paper 108 on which an image has been recorded is ejected onto the ejection tray 140.

The image receiving paper 108 is stored in a layer configuration on a tray 144 beforehand, and this tray is loaded in a tray loading port 146 provided at an upper surface of the casing 110. The image receiving paper 108 is extracted one by one from the tray 144 that is loaded in the tray loading port 146, and guided to the ejection tray 140 after an image has been transferred to the image receiving paper 108.

Two circular cover members 148 and 150 that are individually detachable are mounted at a right side surface (seen toward the bottom of FIG. 1) of the casing 110. Inside the apparatus along the axial direction of these cover members 148 and 150, as shown in FIG. 3, there are disposed a feed reel 152 and a take-up reel 154 for winding up the photosensitive material 106 in a roll form. These reels can be taken out or loaded in a state in which the cover members 148 and 150 have been removed.

(Image Receiving Paper Conveyance System)

As shown in FIG. 3, the tray 144 loaded in the tray loading port 146 is loaded such that an upper surface of a tip thereof opposes a semicircular roller 156.

A portion of the circumferential surface of the semicircular roller 156 is cut at a surface parallel to an axis to form a notched portion 158. The notched portion 158 generally opposes an uppermost layer of the image receiving paper 108 in the tray 144, with an interval of predetermined value disposed therebetween. When the semicircular roller 156 rotates, the uppermost layer of image receiving paper 108 is brought into contact with the circumferential surface of the semicircular roller 156, and one revolution of the semicircular roller 156 extracts the image receiving paper 108 slightly. The extracted image receiving paper 108 is held between a first roller pair 160, and then completely extracted from the tray 144 by a driving force of the first roller pair 160.

At a downstream side of the first roller pair 160, there are sequentially disposed a second roller pair 162, a guide plate 164, and a third roller pair 166, and the image receiving paper 108 is held by the first roller pair 160, then by the second roller pair 162, guided by the guide plate 164, and then held by the third roller pair 166.

With this third roller pair 166, the image receiving paper 108 is also superposed with the photosensitive material 106. In other words, the third roller pair 166 is also used as a conveyance path for the photosensitive material 106.

(Photosensitive Material Conveyance System)

The photosensitive material 106 is loaded in the apparatus in a lengthy form wound up around the feed reel 152 in a layer configuration. The feed reel 152 can be loaded at a predetermined position by removing the cover member 150 (on the rear side of the apparatus) and inserting it in an axial direction.

In a state in which the photosensitive material 106 has been loaded at the predetermined position, the outermost layer is extracted to be loaded along a predetermined conveyance path as an initial setting. The loading procedure is as follows. The outermost layer is extracted from the feed reel 152, held between a fourth roller pair 168 in a vicinity of the feed reel 152 loading position, and then held between the third roller pair 166 via a reservoir portion 170 and a guide plate 172, and entrained on a heat roller 174 so that it is entrained on a winding reel 154. In this case, a leader tape for a length necessary for loading may be provided at the tip of the photosensitive material 106 wound on the feed reel 152.

An exposure portion 176 is disposed between the fourth roller pair 168 and the reservoir portion 170 along the conveyance path of the photosensitive material 106. In addition, a water application portion 178 is disposed between the reservoir portion 170 and the guide plate 172. The exposure portion 176 and the water application portion 178 will be described later in detail. As a process, after an image has been exposed on the photosensitive material 106 at the exposure portion 176, the photosensitive material 106 is superposed with the image receiving paper 108 by the third roller pair 166 in a state in which water has been applied to the emulsion surface (exposure surface).

(Heat Roller)

The heat roller 174 is a thermal development transfer portion in the apparatus, having a cylindrical roller body 180, and a heater 182 disposed along an axis inside the roller body 180. the heat roller 174 has a function for applying heat on a member entrained on the roller body 180 (photosensitive material 106 and image receiving paper 108), with the surface of the roller body 180 being heated by an operation of the heater 182. Thermal development transfer processing is performed by this heating, so that an image recorded on the photosensitive material 106 is transferred onto the image receiving paper 108.

In a lower left vicinity of the heat roller 174, there are disposed a stripping roller 184 and a stripping claw 186, so that the image receiving paper 108 entrained on the heat roller 174 by about one third is peeled away from the photosensitive material 106, and guided toward the ejection tray 140.

The photosensitive material 106 is wound on the heat roller 174 by about ½, and guided to a position where the winding reel 154 is loaded, with the direction being changed by 180 degrees.

(Water Application Portion)

As shown in FIG. 3, the water application portion 178 has a function for adding water as an image formation solvent to the photosensitive material 106 or the image receiving paper 108, whereby the superposed surfaces of both are adhered together and thermally developed. The water application portion 178 comprises a lengthy application piece 188 along the width direction of the photosensitive material 106, and a tank 190 for storing water.

The application piece 188 is a member having high absorbency such as a felt or sponge, and having an adequate hardness, so that the photosensitive material 106 is brought into contact therewith at a predetermined pressure at the time of conveyance. Using a capillary phenomenon, an appropriate amount of water within the tank 190 is continually moved to the application piece 188. The photosensitive material 106 is brought into contact with the application piece 188 so that the water is applied to the surface (emulsion surface) of the photosensitive material 106 by the application piece 188.

Moreover, since the application piece 188 is abutted against the photosensitive material 106 with an appropriate pressure, water is applied uniformly.

The water in the tank 190 is replenished by removing the whole water application portion 178. However, pipes may be provided so that water is continuously supplied from outside of the apparatus.

In the present embodiment, water is used as the image formation solvent, but this water is not limited to pure water, and may be water in a broad sense. Moreover, it may be a mixed solvent of water and a solvent having a low boiling point, such as methanol, DMF, acetone or di-isobutylketone. Alternatively, it may be a solution having an image formation accelerating agent, a fogging prevention agent, a development terminator, a hydrophilic thermal solvent or the like.

(Exposure Portion)

Figure 4:
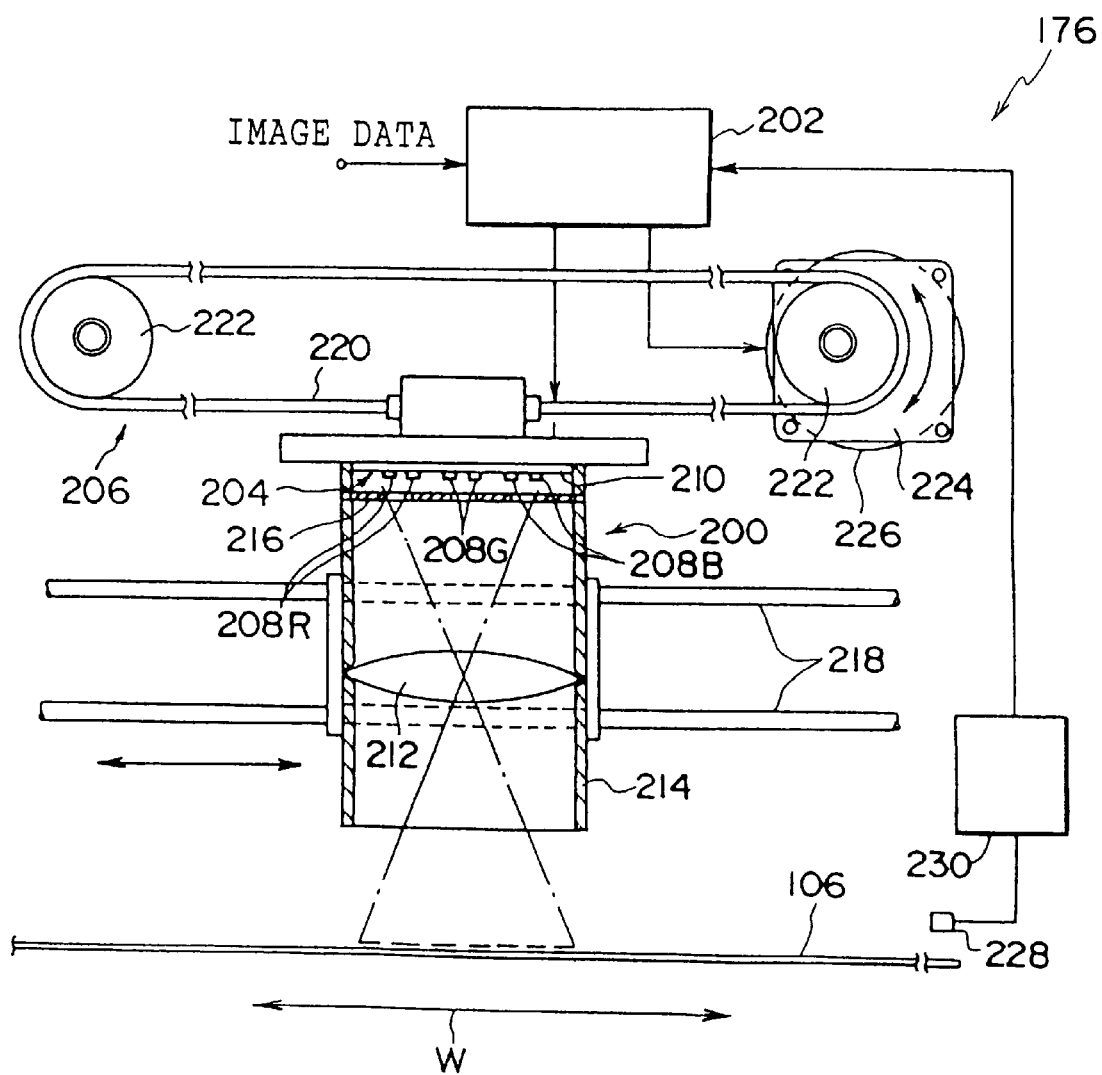
FIG. 4 is an elevational view showing a schematic structure of an exposure portion.

FIG. 4 shows an exposure portion 176 according to the present embodiment (see also FIG. 3).

The exposure portion 176 has as a main structure a light source unit 200 disposed above the photosensitive material 106 conveyance path, and is connected to a controller 202. Image data (image data read from the CD-ROM 102 and floppy disc 104) is inputted to the controller 202, and a light source portion for full-color image formation 204 in the light source unit 200 is lighted up according to the image data. The structure of the portion which lights up the light source portion for full-color image formation 204 and the periphery thereof in the controller 202 particularly associated with the present invention, that is, the structure including a portion corresponding to the multi-channel pulse width modulation apparatus of the present invention, will be described in detail later.

The light source unit 200 is movable in the width direction (main scanning direction) of the photosensitive material 106 by a driving of the main scanning unit 206 described later. Main scanning is performed at the time the photosensitive material 106 is stopped when the exposure portion 176 is step moved.

The light source unit 200 in the exposure portion 176 is covered with a box-shaped exposure casing 214, and the light source portion for full-color image formation 204 is disposed at an upper end surface of the exposure casing 214, so that an emission surface of the light source portion for full-color image formation 204 surfaces an opening of the exposure casing 214. An aperture 216 in which rectangular openings are provided for each luminescent color is disposed on the emission surface of the light source portion for full-color image formation 204. The aperture 216 controls the spread of light from R-LED chips 208R, G-LED chips 208G and B-LED chips 208B (each having 11 LEDs, respectively, see FIG. 5) which emit light of each color R (red), G (green) and B (blue).

A lens 212 is disposed at a center of the exposure casing 214 at a downstream side of the aperture 216. The lens 212 has a function that condenses light from the light source portion for full-color image formation 204 to form an image in a vicinity of the photosensitive material 106. The resolution of the imaged light is about 300 to 400 dpi. Though the lens 212 is shown as a single lens in the figure, a plurality of lenses may be combined to form a single lens system.

Here, the lens 212 is formed by a plurality of lenses and a stop. When the lens has a property in which magnification does not vary even if a height of the image surface changes to a certain extent, microscopic errors at the time of main scanning movement due to the main scanning unit 206 and the like can be absorbed.

Moreover, the focus of the lens is always adjusted by an auto-focus mechanism (not shown in the drawings).

The light source unit 200 is supported by a pair of mutually parallel guide shafts 218 that form a portion of the main scanning unit 206. The guide shafts 218 are disposed along the width direction of the photosensitive material 106 (in the direction of an arrow W in FIG. 4), and the light source portion for full-color image formation 204 is guided by the guide shafts 218 so as to be movable in the width direction of the photosensitive material 106.

A portion of an endless timing belt 220 is fixed to the exposure casing 214 of the light source portion for full-color image formation 204. Both ends of the timing belt 220 are respectively entrained on sprockets 222 positioned in a vicinity of both ends of the guide shafts 218. The rotation axis of one sprocket 222 is connected to the rotation axis of the stepping motor 226 via a transmission 224, and the light source portion for full-color image formation 204 is reciprocated along the guide shaft 218 by the back and forth rotational movement of the stepping motor 226.

Drive of the stepping motor 226 is controlled by the controller 202 and synchronized with the stepping motion of the photosensitive material 106. In other words, in a state in which the photosensitive material 106 has moved by one step and stopped, the stepping motor 226 initiates rotation, whereby the light source portion for full-color image formation 204 moves over the photosensitive material 106 along the width direction of the photosensitive material 106. After the predetermined pulse is confirmed, the stepping motor 226 is rotated in reverse, whereby the light source portion for full-color image formation 204 returns to its former position. At the same time as the operation in which the light source portion for full-color image formation 204 is returned to its former position, the next movement of the photosensitive material is initiated.

A photo diode 228 is disposed at the light output side of the light source unit 200, that is, opposite to the photosensitive material 106 and in a vicinity of the main scanning starting position. The photo diode 228 outputs an analog signal having a size proportional to a light amount of the light source from the light source portion for full-color image formation 204. The photo diode 228 is connected to a light amount correction unit 230, and the analog signal is inputted to this light amount correction unit 230.

The light amount correction unit 230 has a function that compares light amounts from detected LED chips 208 of respective colors, adjusts light amounts and color balance, and outputs corrected values to the controller 202. Image data transferred to the light source portion for full-color image formation 204 is thus corrected on the basis of the corrected values, whereby each LED chip 208 lights up at appropriate light amounts.

Figure 5:
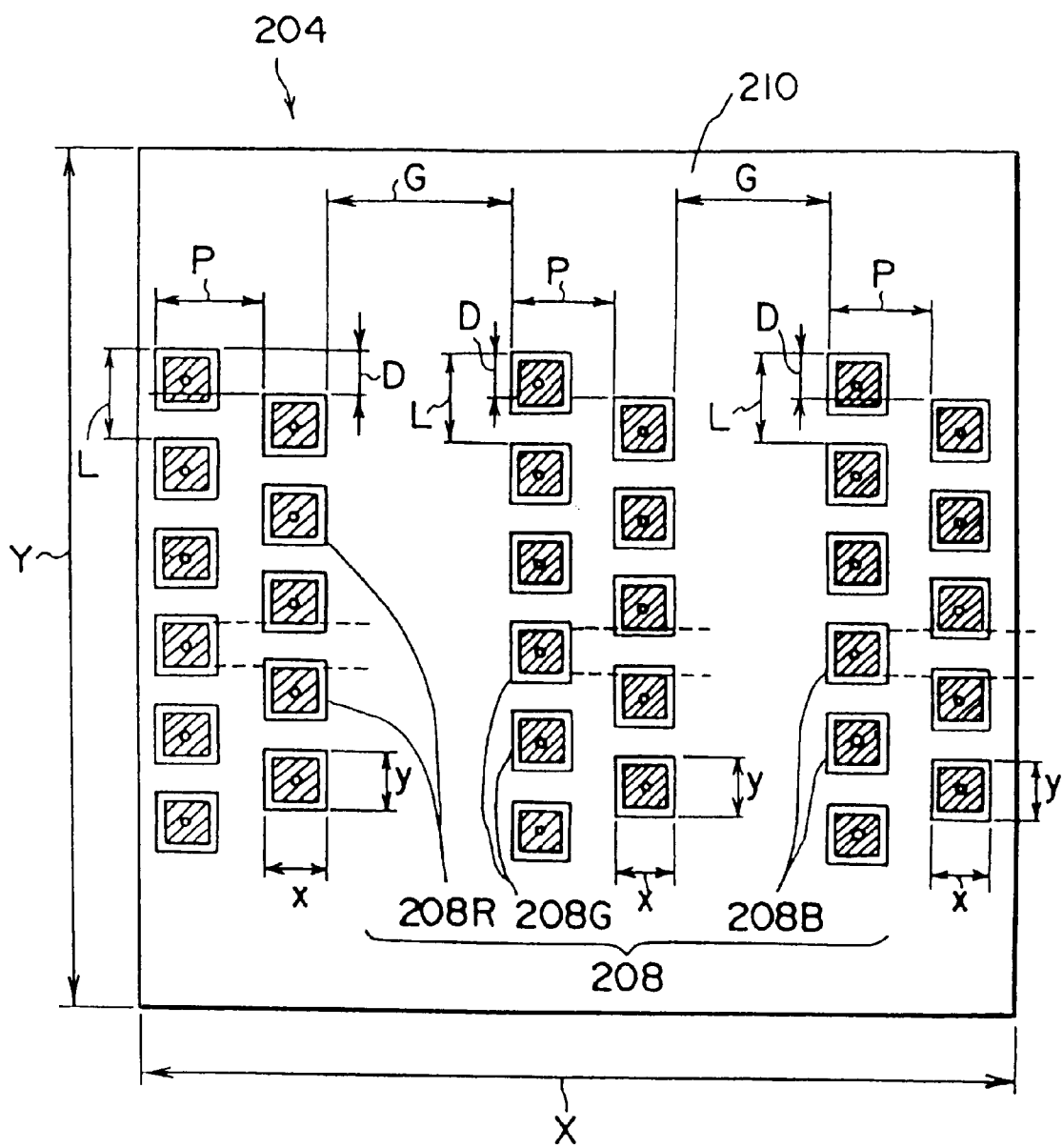
FIG. 5 is a plan view showing an outline of a disposed state of LED chips in a light source portion.

As shown in FIG. 5, the light source portion for full-color image formation 204 is formed by B-LED chips 208B, G-LED chips 208G and R-LED chips 208R, which are mounted respectively on a substrate 210 in conformity with an identical rule of array along the width direction (main scanning direction) of the photosensitive material 106. Namely, 11 B-LED chips 208B are disposed in two rows in a staggered configuration at a right end of the substrate 210 seen in plan view, 11 R-LED chips 208R are disposed in two rows in a staggered configuration at a left end of the substrate 210, and 11 G-LED chips 208G are disposed in two rows in a staggered configuration at a center of the substrate 210. Thus, the LED chips are arranged in six rows in total.

Predetermined wiring is provided on the substrate 210 by an etching processing or the like. The wiring is covered with a metal so that short-circuit does not occur between the wiring, and has a heat dispersion function. Accordingly, heat radiation due to the lighting up of the LED chips 208 can be suppressed, whereby fluctuations in emission amounts can be curbed. The dimension (x×y) of the LED chip 208 is about 360×360 μm.

As shown in FIG. 5, it is preferable that the pitch between rows of the same color (pitch in the main scanning direction) P of the LED chips 208 to be mounted on the substrate 210 is 600 μm, the line pitch of each row (pitch in the sub-scanning direction) L is 520 μm, the size of difference in level D when being formed in a zigzag form is 260 μm, and the gap size between each color G is the same between R–G and G–B. Moreover, shaded portions in the LED chips 208 shown in FIG. 5 are actually emission regions. Upper boundaries of emission areas of LED chips emitting the same color of light (e.g., blue) correspond to lower boundaries of emission areas of LED chips adjacent thereto that emit the same color of light (e.g., blue), such that an imaginary line drawn to connect the upper boundary of one chip with the lower boundary of a respectively adjacent chip forms a substantially straight line. In FIG. 5, this relationship is indicated by broken lines. (In other words, the rows for each LED color are staggered or offset relative to one another, and the amount of offset corresponds to a height of the region of actual emission.)

According to the light source portion for full-color image formation 204 having the above-described structure, eleven main scanning lines can be recorded on the photosensitive material 106 by one main scanning for each color. The main scanning line pitch becomes an even number 10.

Figure 6:
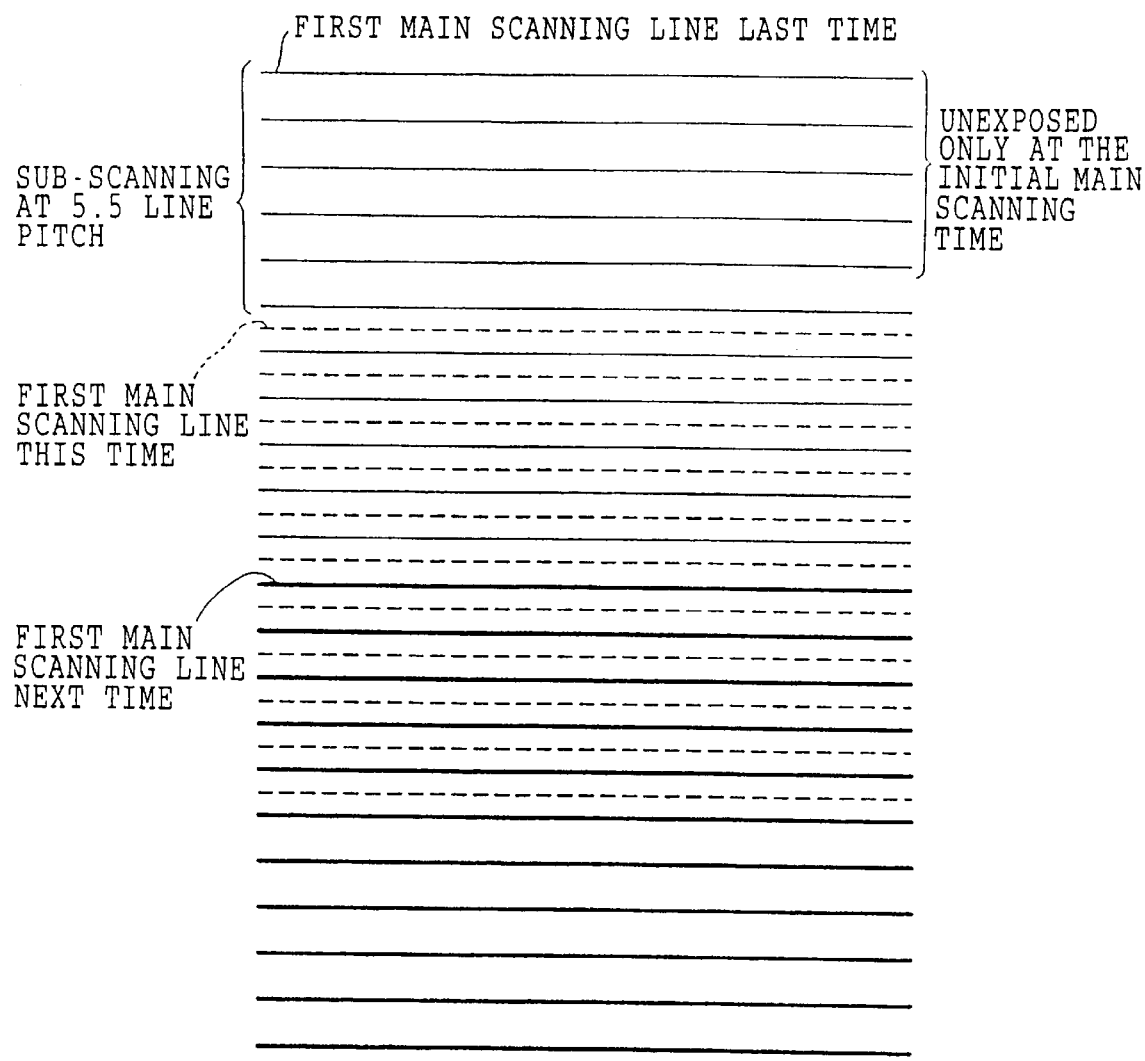
FIG. 6 is a plan view of a photosensitive material showing the state of a main scanning line and a sub-scanning pitch.

Here, as shown in FIG. 6 in the present embodiment, the stepping motion of the photosensitive material 106 is controlled such that driving and stopping of sub-scanning is repeated at a pitch (5.5 line pitch) at which a first main scanning line recorded on the photosensitive material 106 of the present scanning arrives at a central position between sixth seventh main scanning lines of a previous scanning. In FIG. 6, fine solid lines denote eleven main scanning lines formed by the previous main scanning, broken lines denote eleven main scanning lines formed by the main scanning of the present scanning, and thick solid lines denote eleven main scanning lines formed by a main scanning of a next scanning.

In this manner, the number of spaces between the main scanning lines is made even (that is, 10 spaces) by disposing an odd number of LED chips 208, and main scanning lines are also formed for half the number between main scanning lines to thereby double resolution. In this manner, since odd numbers of LED chips 208 are formed for each luminescent color to make an even number of spaces between the LED chips 208, main scanning lines are formed for half the number between main scanning lines and the sub-scanning pitch can be made the same. Moreover, from the standpoint of control, first through fifth scanning lines at the time main scanning is initially driven do not effect writing.

Next, the structure of a portion and the periphery thereof which lights up the light source portion for full-color image formation 204 in the controller 202, which is particularly related to the present invention, that is, the structure of a portion including a portion corresponding to the multi-channel pulse width modulation apparatus of the present invention, will be described in detail, with reference to FIG. 7.

The controller 202 has a CPU 10 for controlling the operation of the controller 202; a data separator 12 which divides image data serially input with respect to eleven R-LED chips 208R, eleven G-LED chips 208G and eleven B-LED chips 208B respectively provided and outputs the divided data; buffers 14$m$ (m=1 to 33; the same hereafter) in the same number as that of LED chips (in the present embodiment, 33); and PWM generators 50$m$.

The output terminal of the data separator 12 is connected to respective input terminals of the buffers 14$m$, and respective output terminals of the buffers 14$m$ are connected to respective input terminals of the PWM generators 50$m$. Moreover, respective output terminals of the PWM generators 50$m$ are connected to respective base terminals of transistors 20$m$ provided in the same number as that of the LED chips, via a parallel circuit formed of a capacitor and a resistor, respectively, in series.

A collector terminal of each transistor 20$m$ is connected to a cathode terminal of either one of R-LED chips 208R, G-LED chips 208 or B-LED chips 208B, via a resistor. In addition, a predetermined power source voltage Vcc is applied to an anode terminal of each LED chip. Moreover, an emitter terminal of each transistor 20$m$ is grounded.

The CPU 10 is connected to the light amount correction unit 230 and the data separator 12. Corrections of image data inputted to the data separator 12 are performed on the basis of the correction values inputted from the light amount correction unit 230. In addition, delay selection data 40B (see FIG. 8) having a one-bit structure is added to image data 40A, which has been divided for each LED chip by the data separator 12 and corrected. Accordingly, the data (hereinafter referred to as "PWM data") 40 to be outputted to respective buffers 14m from the data separator 12 comprises the image data 40A and the delay selection data 40B.

Moreover, the CPU 10 is also connected to respective buffers 14m, respective PWM generators 50m and the stepping motor 226. The CPU 10 outputs to each buffer 14m an output control signal 74 that controls output timing of the PWM data stored in the buffer 14m; outputs to each PWM generator 50m a pixel clock 42 showing one cycle when an image for one pixel is recorded in the main scanning direction; and controls the stepping motion of the light source portion for full-color image formation 204.

The CPU 10 is also connected to a terminal for outputting PWM start schedule data 28m and a terminal for inputting the delay setting data 70m (described later) at each PWM generator 50m, so that the PWM start schedule data 28m can be inputted from each PWM generator 50m and the delay setting data 70m can be outputted to each PWM generator 50m.

Figure 8:
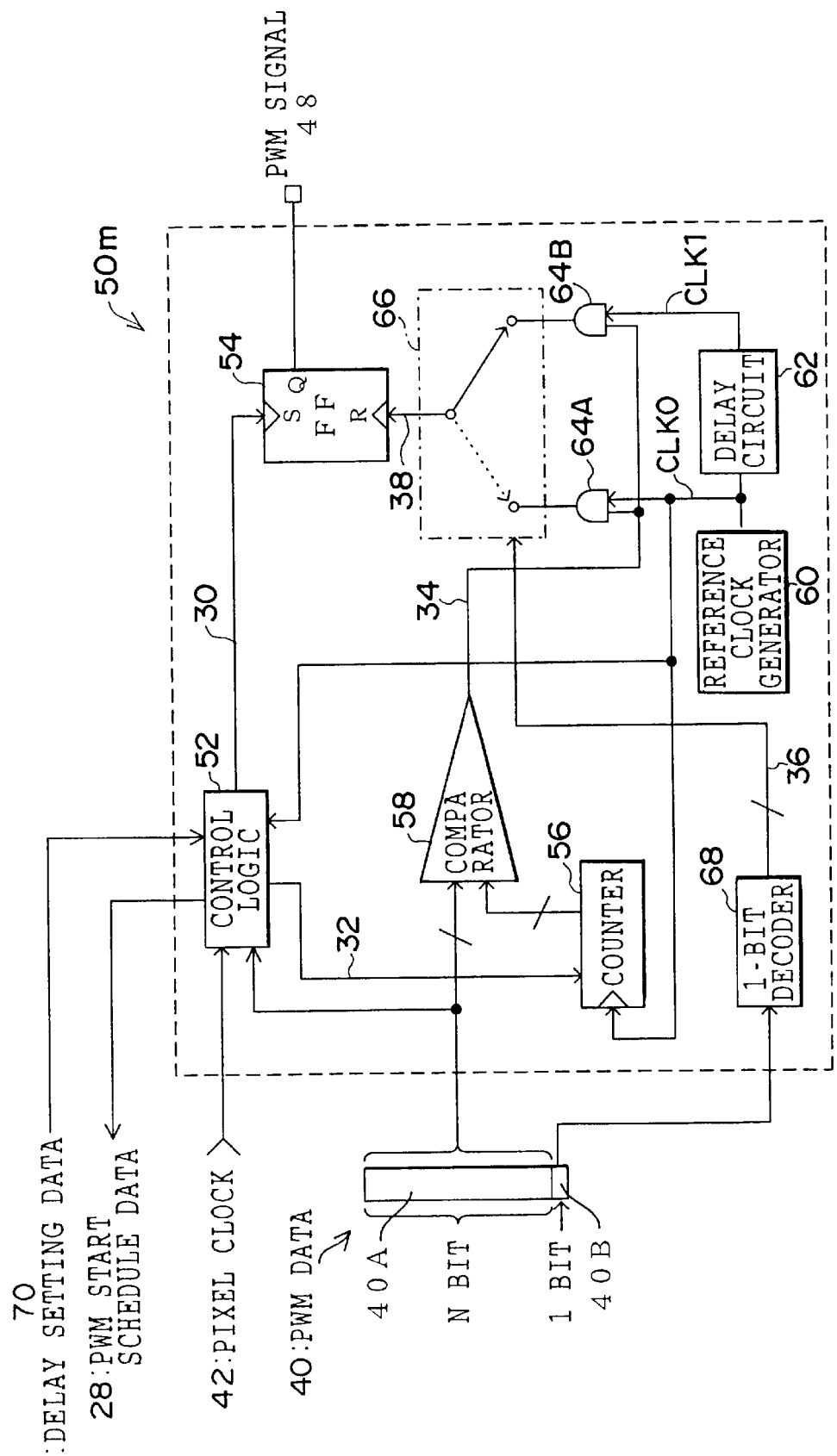
FIG. 8 is a block diagram showing a structure of a PWM generator according to the first embodiment.

Next is a description of a structure of the PWM generator 50m, with reference to FIG. 8. As shown in FIG. 8, the PWM generator 50 is provided with a control logic 52, whose input terminal is connected to the CPU 10 so that the pixel clock 42 is inputted. Three output terminals of the control logic 52 are respectively connected to a set terminal (S terminal) of R-S flip flop 54, a reset terminal of a counter 56, and the CPU 10, thereby enabling output of a PWM start signal 30 to the R-S flip flop 54, output of a reset signal 32 to the counter 56, and output to the CPU 10 of the PWM start schedule data 28 that shows the output timing of the PWM start signal 30 to the R-S flip flop 54.

Moreover, three input terminals of the control logic 52, other than the input terminal for inputting the pixel clock 42, are respectively connected to the corresponding buffers 14, a reference clock generator 60 (described later), and the CPU 10, thereby enabling input of the image data 40A having N-bit structure in the PWM data 40 stored in the buffer 14, input of a reference clock CLK0 from the reference clock generator 60, and input of the delay setting data 70 from the CPU 10.

The PWM generator 50 is provided with a comparator 58. One input terminal of the comparator 58 is connected to a corresponding buffer 14, so that the image data 40A in the PWM data 40 stored in the buffer 14 is inputted. The other input terminal of the comparator 58 is connected to an output terminal which outputs a discrete value of the counter 56. Accordingly, the comparator 58 compares the image data 40A and the discrete value of the counter 56.

Furthermore, the PWM generator 50 is provided with the reference clock generator 60 which generates and outputs a reference clock CLK0 that serves as a reference for the generation timing of the PWM signal 48. An output terminal of the reference clock generator 60 is connected to the input terminal of a delay circuit 62, in which only a predetermined time having a value shorter than one cycle of the reference clock CLK0 (in the present embodiment, time corresponding to a half cycle of the reference clock CLK0) is delayed and output as a delay clock CLK1.

The output terminal of the reference clock generator 60 is branched and connected to the pulse input terminal of the counter 56 and one input terminal of a two-input and one-output AND gate 64A. Therefore, in the counter 56, the number of pulses of the reference clock CLK0 is counted. The output terminal of the delay circuit 62 is connected to another input terminal of the two-input and one-output AND gate 64B.

Other respective input terminals of an AND gate 64A and an AND gate 64B are connected to the output terminal of the comparator 58, and respective output terminals of the AND gate 64A and the AND gate 64B are connected to each input terminal of a two-input and one-output selector 66, with the output terminal thereof being connected to the reset terminal (R terminal) of the R-S flip flop 54.

Moreover, the selection signal input terminal of the selector 66 is connected to an output terminal of a one-bit decoder 68, whose input terminal is connected to a corresponding buffer 14 so that the delay selection data 40B is inputted. The one-bit decoder 68 decodes the delay selection data 40B inputted from the buffer 14, and inputs the data as a clock selection signal 36 to the selection signal input terminal of the selector 66. The selector 66 is structured so that when the clock selection signal 36 inputted to the selection signal input terminal shows 0, the input terminal connected to the output terminal of the AND gate 64A is selected, and when the clock selection signal 36 shows 1, the input terminal connected to the output terminal of the AND gate 64B is selected.

The CPU 10 corresponds to the determination section of the present invention, the PWM 50m generator corresponds to the pulse width modulation signal generation section of the present invention, the signal indicating the delay setting data 70m corresponds to the timing signal of the present invention and the signal indicating the PWM start schedule data 28m corresponds to the schedule timing signal of the present invention.

(Reservoir Portion)

The reservoir portion 170 (see FIG. 3) is disposed between the exposure portion 176 and the water application portion 178, and has two pairs of holding rollers 192 and 194, and one dancer roller 196. The photosensitive material 106 is taken over the two pairs of holding rollers 192 and 194, so as to provide a substantially U-shaped slackening in the photosensitive material 106 between the roller pairs 192 and 194. The dancer roller 196 is moved vertically corresponding to the slackening to hold the photosensitive material 106 in the slackening portion.

With the exposure portion 176, the photosensitive material 106 is moved stepwise, however, in the water application portion 178, it is necessary to conveyance the photosensitive material 106 at a certain speed for uniform application of water. Therefore, a difference in the conveyance speed of the photosensitive material 106 occurs between the exposure portion 176 and the water application portion 178. In order to absorb the speed difference, the dancer roller 196 is moved vertically, to thereby adjust the slackening amount of the photosensitive material 106, so that the stepping motion and constant speed motion of the photosensitive material 106 can be simultaneously performed.

(Operation)

Operation of the present embodiment will now be described. First, the overall flow for image recording will be described.

The tray 144 is loaded in the tray loading port 146, and the feed reel 152 having the photosensitive material 106 being wound thereon and the winding reel 154 in an empty state are respectively loaded in a predetermined position, whereby loading is completed. In this state, when the print start key of the operation display portion 112 is operated, the controller 202 reads the image data from the CD-ROM 102 or floppy disc 104, the read image data is divided for each LED chip by the data separator 12, and the delay selection data 40B is added to each divided image data 40A and stored in the corresponding buffer 14m.

When the controller 202 stores the image data 40A and the delay selection data 40B, that is, the PWM data 40, the feed reel 152 is driven to thereby start the conveyance of the photosensitive material 106.

When the photosensitive material 106 reaches a predetermined position at the exposure portion 176, the photosensitive material 106 is momentarily stopped, and the PWM signal 48m of a pulse width corresponding to the image data 40A is output from respective PWM generators 50m disposed in the controller 202 corresponding to each LED chip 208 to the light source portion for full-color image formation 204. The PWM signal 48m is output for each of the eleven lines, and the light source portion for full-color image formation 204 is guided by the guide shafts 218 by the driving of the stepping motor 226 and moves along the width direction of the photosensitive material 106 (main scanning).

Here, before starting output of the PWM signal 48m, the light amount of each color from the light source portion for full-color image formation 204 is detected by the photo diode 228, and the correction value for adjusting light amount and color balance or the like is supplied to the CPU 10 in the controller 202 by the light amount correction unit 230, whereby respective image data 40A is corrected. Correction is executed for each image.

As shown in FIG. 6, when one main scanning is completed, the photosensitive material 106 is moved by one step (5.5 line pitch) and stopped, so that a second main scanning is performed. By repeating this, an image for one frame is recorded on the photosensitive material 106. In other words, the main scanning lines are formed at a half pitch of the disposed pitch of the LED chips 208, thereby improving resolution. In this case, the first five lines from the top at the first main scanning drive on one screen and the last five lines from the bottom at the last main scanning drive may be unexposed (extinguish lights of the LED chips 208).

The photosensitive material 106 for which recording is completed is held in a slackened state in the reservoir portion 170 so that it is entrained on the dancer roller 196 by driving only the holding roller pair 192 on the upstream side of the reservoir portion 170 (the holding roller pair 194 on the downstream side is stopped), and does not reach the water application portion 178.

When the photosensitive material 106 of a length for one image is accumulated, the holding roller pair 194 on the downstream side of the reservoir portion 170 starts to drive. As a result, the photosensitive material 106 (on which an image has been recorded) is conveyed to the water application portion 178. In the water application portion 178, the photosensitive material 106 is conveyed at a constant speed, so that water is uniformly applied thereto by the application piece 188.

Because water is continuously supplied from the tank 190 to this application piece 188 and the photosensitive material 106 is pressed with a predetermined pressure, an adequate amount of water is applied to the photosensitive material 106.

The photosensitive material 106 to which water has been applied is guided by the guide plate 172 and conveyed to the third roller pair 166.

With regard to the image receiving paper 108, the semicircular roller 156 resolves one time to bring the peripheral surface of the semicircular roller 156 into contact with the tip portion of the image receiving paper 108, and the outermost layer of the image receiving paper 108 is extracted and held between the first roller pair 160. The image receiving paper 108 is extracted by the driving of the first roller pair 160, and waits for the arrival of the photosensitive material 106 in a state in which the image receiving paper 108 is held between the second roller pair 162.

Synchronous to the passage of the photosensitive material 106 through the guide plate 172, the driving of first roller pair 160 and the second roller pair 162 is initiated, and the image receiving paper 108 is guided by the guide plate 164 and conveyed to the third roller pair 166.

The third roller pair 166 holds the photosensitive material 106 and the image receiving paper 108 in a state in which the photosensitive material 106 and the image receiving paper 108 are superposed with each other, and conveyances these to the heat roller 174. At this time, the photosensitive material 106 and the image receiving paper 108 are adhered together by means of the water applied to the photosensitive material 106.

The photosensitive material 106 and the image receiving paper 108 superposed with each other are entrained on the heat roller 174, and are subjected to heat from the heater 182, whereby thermal development transfer processing is performed. In other words, the image recorded on the photosensitive material 106 is transferred and imaged onto the image receiving paper 108.

The thermal development transfer is completed in a state in which the image receiving paper 108 is entrained on the heat roller 174 by about ⅓. The image receiving paper 108 is peeled away from the photosensitive material 106 by the stripping roller 184 and the stripping claw 186, and ejected onto the ejection tray 140, while being entrained on the stripping roller 184.

On the other hand, after the photosensitive material 106 has been entrained on the heat roller 174 by about ½, it is shifted in a tangential direction and wound on the winding reel 154.

Figure 9:
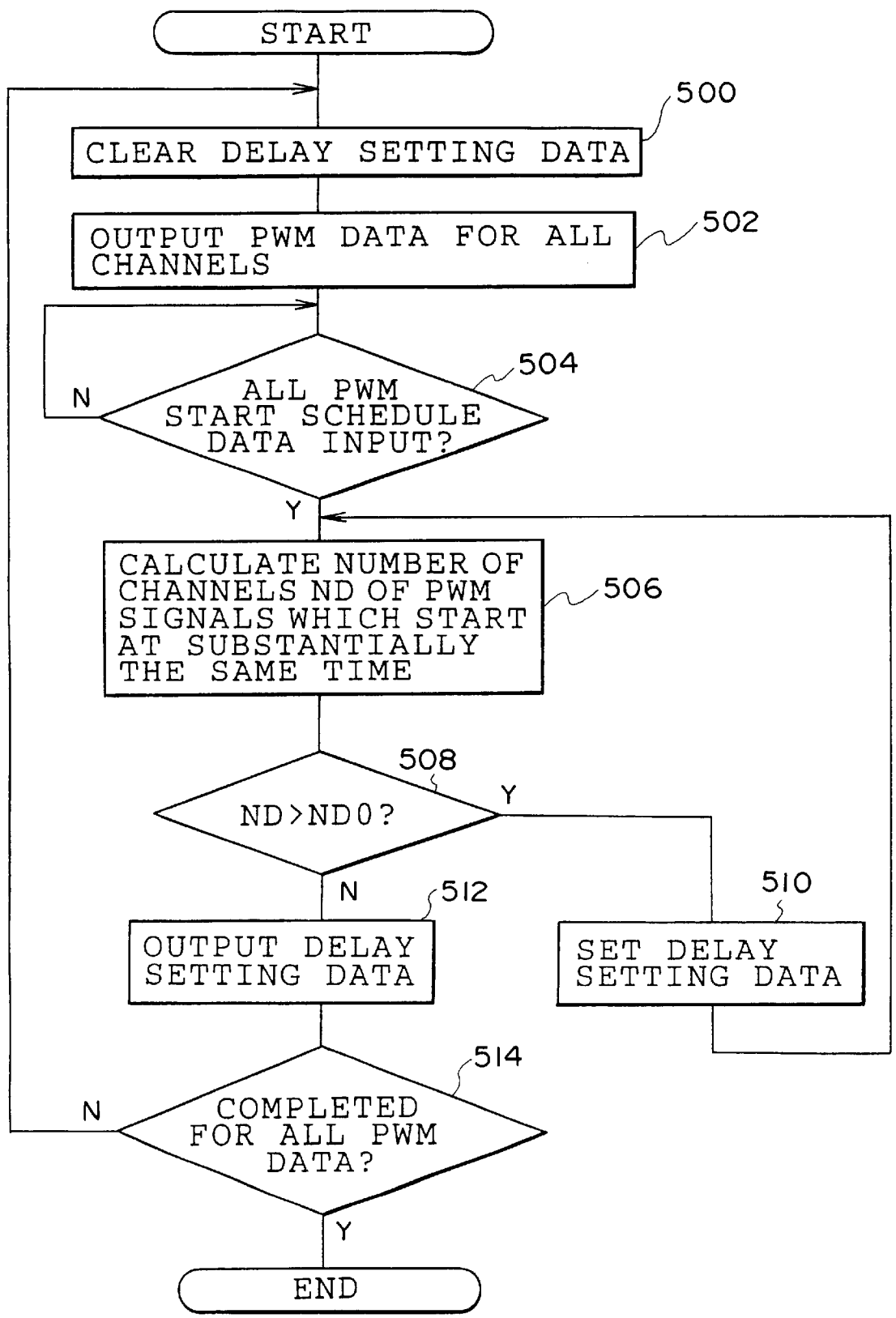
FIG. 9 is a flow chart of a program executed by a CPU in the controller according to the first embodiment.
Figure 10:
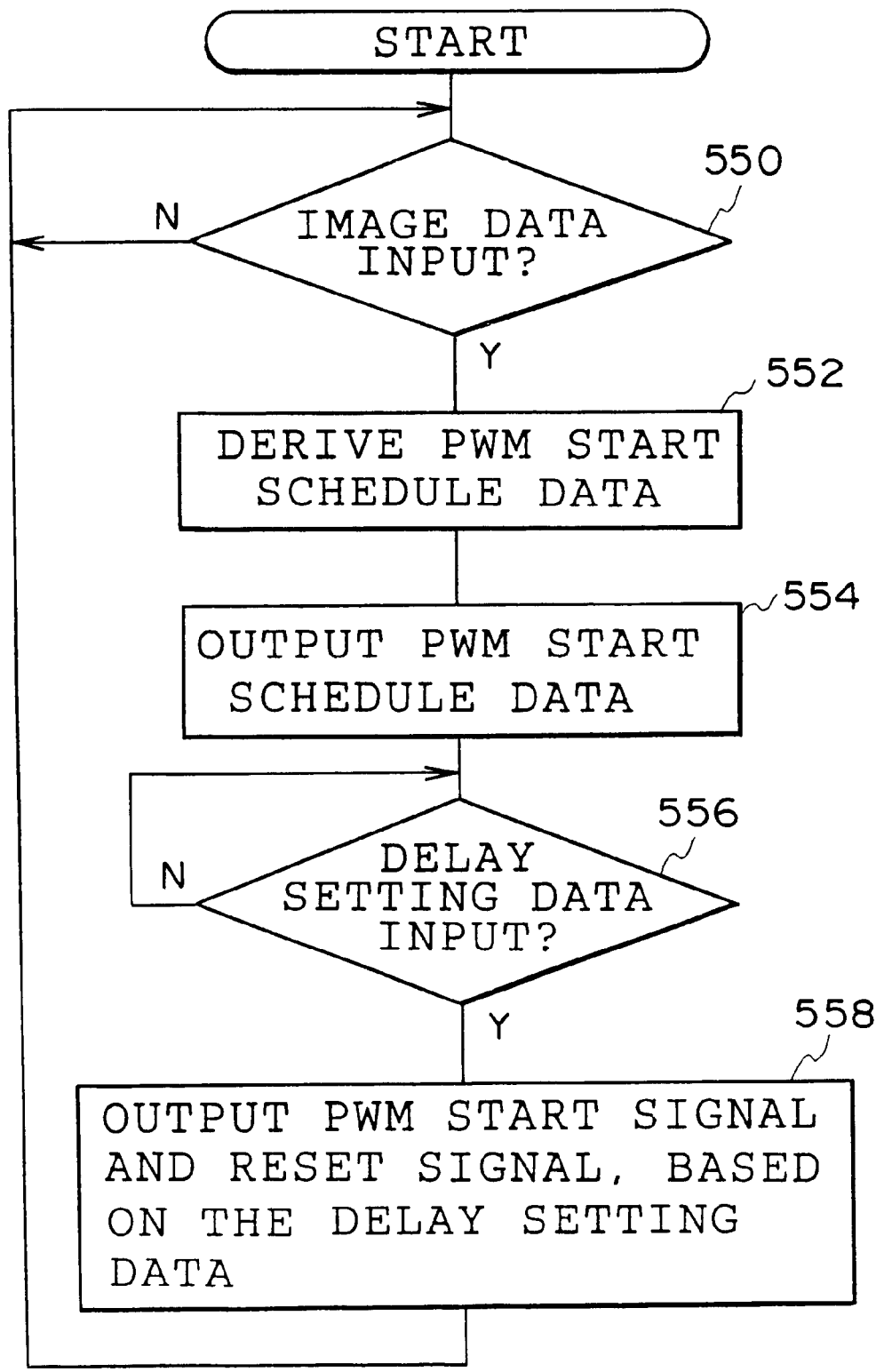
FIG. 10 is a flow chart of a program executed by a control logic of the PWM generator according to the first embodiment.
Figure 11:
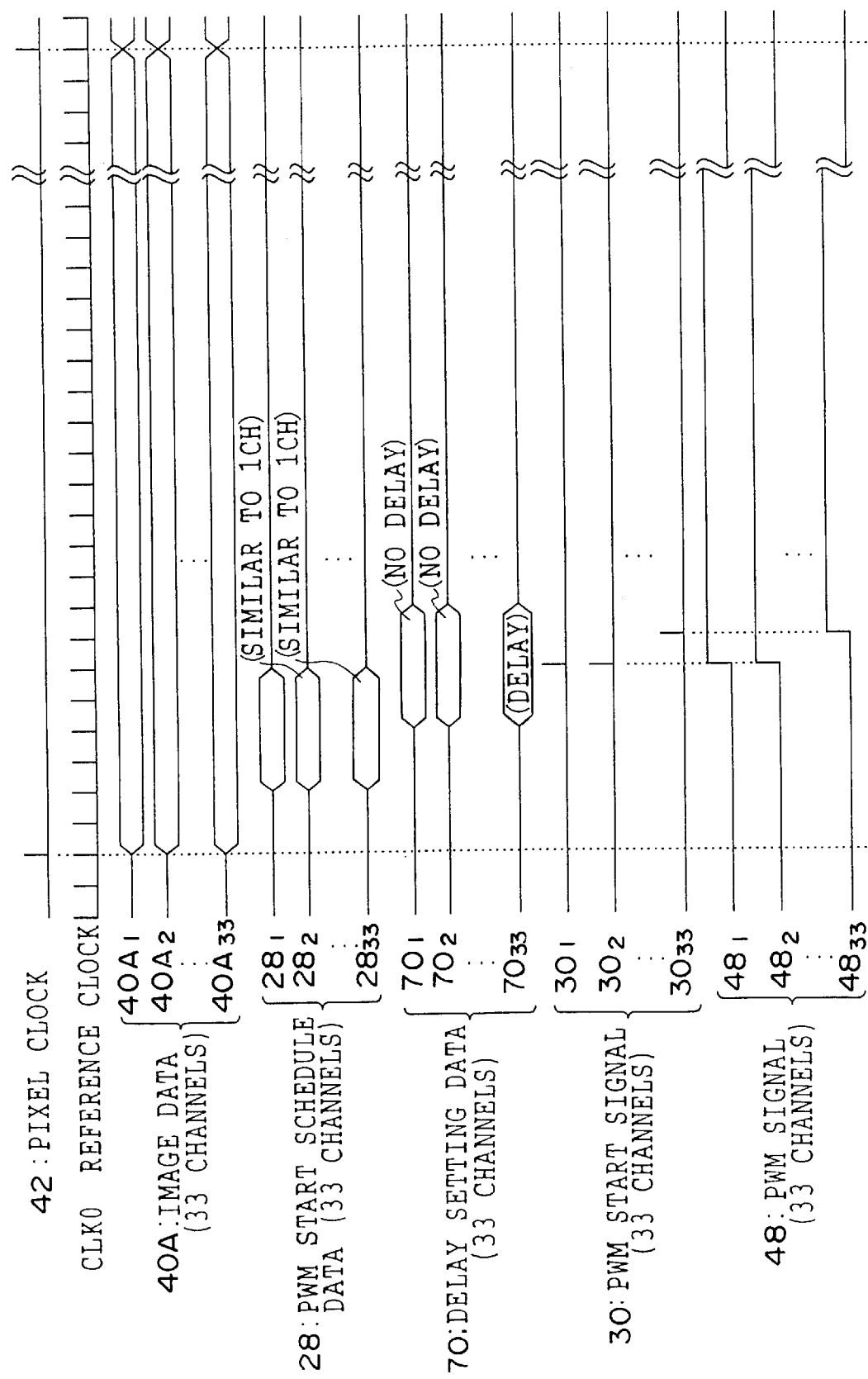
FIG. 11 is a timing chart used for an explanation of an operation of the controller according to the first embodiment.

Next is a detailed description of an operation when the PWM signals 48m for multi channels (33 channels) are formed by the controller 202, with reference to FIG. 7 to FIG. 11. FIG. 9 is a flow chart of a program executed by the CPU 10 in the controller 202 after the PWM data 40 has been stored in the respective buffers 14m. FIG. 10 is a flow chart of a program executed by the control logic 52 in the respective PWM generators 50m, and FIG. 11 is a timing chart showing one example of change in elapsed time of main signals inside the controller 202. Here, description is given based on the assumption that a pixel clock 42 having a predetermined frequency of the pixel clock 42 has been input to the control logic 52 in each PWM generator 50m, and a reference clock CLK0 having a higher frequency than the predetermined frequency has been generated by the reference clock generator 60. First, the operation of the CPU 10 will be described.

In step 500 in FIG. 9, all of the delay setting data 70m are cleared (substituted by 0), and in the next step 502, PWM data 40 (image data 40A and delay selection data 40B) for all channels are output to corresponding PWM generators 50. As a result, the image data 40A is inputted to the control logic 52 in each PWM generator 50m, respectively, as shown in FIG. 11.

The control logic 52 in each PWM generator 50m to which the image data 40A has been inputted calculates a timing when a pulse is started (that is, pulse starting timing of the PWM signal 48) such that the center of the PWM signal 48 having a pulse width corresponding to the image data 40A is positioned in the vicinity of the center position between each pulse of the pixel clock 42, and outputs the PWM start schedule data 28 showing the timing to the CPU 10. In the present embodiment, the PWM start schedule data 28 is a number of pulses of the reference clock CLK0 required from the startup of the pixel clock 42 to the startup of the pulse of the PWM signal 48.

In the example shown in FIG. 11, the PWM start schedule data 28 of channel 1, channel 2 and channel 33 have substantially the same value, while the PWM start schedule data 28 in other channels do not have substantially the same value.

In the next step 504, input of the PWM start schedule data 28 in all channels output from respective PWM generators 50m is waited upon. At this time, the CPU 10 stores each PWM start schedule data 28m in a memory (not shown in the drawings) in the CPU 10.

The CPU 10 is able to know in advance the timing when the PWM signal 48 starts in all channels by the processing in steps 502 and 504.

In the next step 506, the number of channels ND of the PWM signals 48 whose startup is performed at substantially the same time (in the present embodiment, within a range of ±5 nS) is calculated by referring to each PWM start schedule data 28m stored in the memory (not shown in the drawings). In the next step 508, whether or not the number of channels ND is larger than the predetermined number ND0 (in the present embodiment, 2) is determined. When the number of ND channels is determined to be larger than the predetermined number ND0 (i.e., an affirmative determination), the process moves to step 510. In step 510, in the channels for which startup of the PWM signals is carried out at substantially the same time, a predetermined delay time is set for delay setting data 70 corresponding to those channels exceeding the predetermined number. Then the process returns to step 506. On the other hand, at the point when the number of ND channels is determined to be no greater than the predetermined number nD0 (i.e., a negative determination), the process moves to step 512. In the present embodiment, the predetermined delay time is set to the delay setting data 70 as a number of pulses of the reference clock CLK0 corresponding to the delay time.

In the example shown in FIG. 11, since the pulse of the PWM signals 48 starts at substantially the same time in channel 1, channel 2 and channel 33, the predetermined delay time is set to the delay setting data 70 corresponding to the 33rd channel which is the channel exceeding the predetermined number ND0 (in the present embodiment, 2).

By repeated processing of the above steps 506 to 510, the delay setting data 70m is set such that the number of PWM signals 48 which start at substantially the same time is no greater than the predetermined number ND0.

In step 512, the delay setting data 70m for each channel is outputted to the control logic 52 of the PWM generator 50 of the corresponding channel.

In the next step 514, whether or not the processing of from step 500 to step 512 has been completed with respect to all of the PWM data 40 is determined. When the processing has not been completed (in the case of a negative determination), the process returns to step 500 to repeatedly perform the processing of from step 500 to step 514, and then this program is completed.

The operation of the control logic 52 will now be described.

In step 550 in FIG. 10, input of the image data 40A is waited upon. In step 552, the PWM start schedule data 28 is derived. In step 554, the derived PWM start schedule data 28 is output to the CPU 10.

As described above, when the PWM start schedule data 28 is inputted from all of the PWM generators 50, the CPU 10 outputs the corresponding delay setting data 70 to the control logic 52 in the respective PWM generators 50.

Therefore, in the next step 556, the input of the delay setting date 70 is waited upon, and in the next step 558 the PWM start signal 30 is outputted to the R-S flip flop 54 and the reset signal 32 is outputted to the counter 56, on the basis of the input delay setting data 70, and then the process returns to step 550.

In other words, when the delay setting data 70 is not 0, the PWM start signal 30 and the reset signal 32 are shifted and outputted so that the timing shown by the PWM start schedule data 28 derived in step 552 is delayed only by the delay time shown by the delay setting data 70, and then the process returns to the step 550. When the delay setting data 70 is 0, the PWM start signal 30 and the reset signal 32 are outputted at a timing shown by the PWM start schedule data 28 derived in step 552, and then the process returns to step 550.

In the example shown in FIG. 11, since only the delay setting data 70 corresponding to the 33rd channel shows the delay, only the output timing with respect to the S terminal of the R-S flip flop 54 of the PWM start signal 30 corresponding to the 33rd channel is delayed.

By the output of the PWM start signal 30 to the S terminal of the R-S flip flop 54 and the output of the reset signal 32 to the counter 56 in step 558 the output level at the Q terminal of the R-S flip flop 54 is raised to start the PWM signal 48, and the discrete value of the counter 56 is reset.

Thereafter, the counter 56 starts to count each pulse of the reference clock CLK0 inputted from the reference clock generator 60, and the discrete value is output to the other side input terminal of the comparator 58.

On the other hand, the image data 40A in the PWM data 40 is inputted to one input terminal of the comparator 58, and a count completion signal 34 which reaches a high level when the image data 40A and the discrete value of the counter 56 coincide is outputted from the comparator 58 and inputted to the other side input terminals of the AND gate 64A and the AND gate 64B, respectively.

Moreover, the reference clock CLK0 is inputted to the one input terminal of the AND gate 64A, and a delay clock CLK1 which is delayed by the time corresponding to the half cycle of the reference clock CLK0 with respect to the reference clock CLK0 is inputted to one input terminal of the AND gate 64B. The clock selection signal 36 corresponding to the delay selection data 40B is also inputted to the selection signal input terminal of the selector 66 by the one-bit decoder 68.

Therefore, the PWM stop signal 38 is inputted from the selector 66 to the R terminal of the R-S flip flop 54 at a timing at which the image data 40A and the discrete value of the counter 56 coincide and which is synchronous to either one of pulses the reference clock CLK0 or the delay clock CLK1 selected in accordance with the clock selection signal 36, whereby the output level of the Q terminal is lowered and the PWM signal 48 is dropped.

Accordingly, the pulse width 48B of the PWM signal 48 when 1 is set as the delay selection data 40B is made longer by the time corresponding to the half cycle of the reference clock CLK0, compared to the pulse width 48A of the PWM signal 48 when 0 is set as the delay selection data 40B. In other words, in this case, double bit resolution can be obtained compared to a case in which the PWM signal 48 is dropped by the reference clock CLK0.

On the other hand, with regard to the start timing of the PWM signal 48, in the example shown in FIG. 11, the PWM start signals 30 of the first channel and the second channel are output at substantially the same time, but the PWM start signal 30 in the 33rd channel is outputted at a delayed timing. Therefore, the PWM signals 48 also start at substantially the same time for the first channel and the second channel, and the PWM signal 48 for the 33rd channel is delayed.

As described above in detail, the controller 202 serving as the multi-channel pulse width modulation apparatus according to the present embodiment determines whether or not the PWM signals exceed a predetermined number and start at substantially the same time. On the basis of the results of the determination, the number of PWM signals that start at substantially the same time is adjusted to a value no greater than the predetermined number. Hence, a decline in operational stability resulting from the pulse width modulation signals becoming effective at substantially the same time can be prevented.

In the present embodiment, description has been given of a case in which the predetermined value ND0 for restricting simultaneous startup of the PWM signal 48 is 2. However, the present invention is not limited thereto. A value of 3 or more, in which a value within a range in which the operational reliability of the apparatus is permitted is taken as the upper limit value, may be used. A value of 1 may also be used.

Because the PWM signals do not start at substantially the same time when the predetermined value ND0 is 1, a decline in operational reliability resulting from a substantially simultaneous startup of the PWM signals can be prevented.

Further, in the present embodiment, description has been given of a case in which, when a predetermined value ND0 for limiting simultaneous startup of the PWM signals 48 is provided, the predetermined ND0 value is exceeded and the PWM signals 48 start at substantially the same time, the number of PWM signals that start at substantially the same time becomes no greater than the predetermined value ND0. However, the present invention is not limited to the same. A mode in which, when the predetermined ND0 value is exceeded and the PWM signals 48 start at substantially the same time, each PWM signal 48 does not start at substantially the same time is also possible.

In this case also, because the PWM signals do not start at substantially the same time when the predetermined ND0 value is exceeded and the PWM signals 48 start at substantially the same time, a decline in operational stability resulting from the pulse width modulation signals starting at substantially the same time can be prevented.

Moreover, in the present embodiment, description has been given of a case in which the PWM start schedule data 28 is fed back from the control logic 52 to the CPU 10, and a determination as to whether or not the PWM signals 48 exceed the predetermined number and start at substantially the same time on the basis of the PWM start schedule data 28. However, the present invention is not limited thereto. In the case of the center starting output, the PWM signals start at substantially the same time, when the value of the image data 40A are the same. Therefore, the CPU 10 refers to the image data 40A between each channel, and a determination as to whether or not the PWM signals 48 exceed the predetermined number and start at substantially the same time on the basis of the reference results.

Also in the present embodiment, in step 510 in FIG. 9, description has been given of a case in which a delay time is set with respect to the delay setting data 70 corresponding to the channel portion exceeding the predetermined number ND0. However, the present invention is not limited thereto. Any form may be used so long as the number of channels of the PWM signals 48 which start at substantially the same time does not exceed the predetermined number ND0.

Also in the present embodiment, description has been given of a case in which the delay setting data 70 shows the number of pulses of the reference clock CLK0 corresponding to the delay time (i.e., a case in which the PWM signal 48 is synchronously delayed with the reference clock CLK0 when the PWM signal 48 is to be delayed). However, the present invention is not limited thereto. A clock signal having a frequency higher than that of the reference clock CLK0 may be used so that the PWM signal is synchronized with the clock signal and delayed (e.g., so that the PWM signal is synchronized with the delay clock CLK1 in the present embodiment and delayed).

Figure 7:
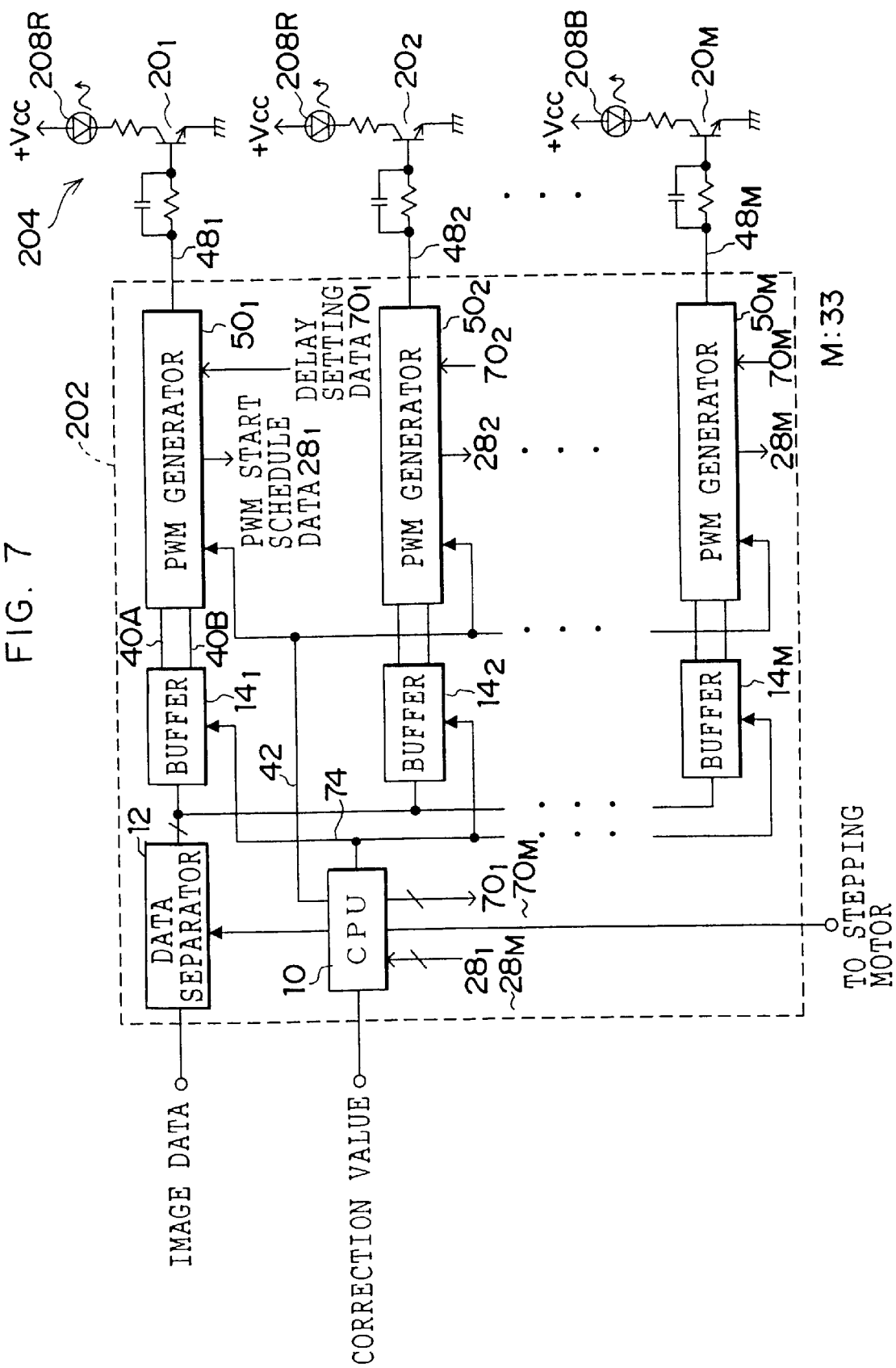
FIG. 7 is a block diagram showing a structure of a portion which lights up the light source portion in a controller according to the first embodiment.

Moreover, the structure shown in FIGS. 7 and 8 is one example, and parts utilized similarly to respective parts in each of the figures may, of course, also be employed.

In the present embodiment, description has been given of a case in which the present invention is executed by software by executing programs shown in FIG. 9 and FIG. 10. However, the present invention is not limited thereto. By producing a logic circuit which works similarly to each program, the present invention may be executed by hardware using the logic circuit.

For example, when PWM signals for 8 channels are generated, the order of priority of each channel is channel 1>channel 2> . . . >channel 8, and when it is controlled such that simultaneous startup of two or more PWM signals does not occur, each of the PWM signal for each channel is designated as the input signal In (n=1 to 8), then the logic circuit of a portion which generates the output signal On showing the presence or absence of a delay with respect to each channel will be as follows.

In this case, a truth table showing the relation between the signal In and the output signal On is as shown in Table 1.

TABLE 1

| I1 | I2 | I3 | I4 | I5 | I6 | I7 | I8 | O1 | O2 | O3 | O4 | O5 | O6 | O7 | O8 |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 |
| 1 | X | X | X | X | X | X | X | 1 | 0 | 0 | 0 | 0 | 0 | 0 | 0 |
| 0 | 1 | X | X | X | X | X | X | 0 | 1 | 0 | 0 | 0 | 0 | 0 | 0 |
| 0 | 0 | 1 | X | X | X | X | X | 0 | 0 | 1 | 0 | 0 | 0 | 0 | 0 |
| 0 | 0 | 0 | 1 | X | X | X | X | 0 | 0 | 0 | 1 | 0 | 0 | 0 | 0 |
| 0 | 0 | 0 | 0 | 1 | X | X | X | 0 | 0 | 0 | 0 | 1 | 0 | 0 | 0 |

TABLE 1-continued

| I1 | I2 | I3 | I4 | I5 | I6 | I7 | I8 | O1 | O2 | O3 | O4 | O5 | O6 | O7 | O8 |
|----|----|----|----|----|----|----|----|----|----|----|----|----|----|----|----|
| 0  | 0  | 0  | 0  | 0  | 1  | X  | X  | 0  | 0  | 0  | 0  | 0  | 1  | 0  | 0  |
| 0  | 0  | 0  | 0  | 0  | 0  | 1  | X  | 0  | 0  | 0  | 0  | 0  | 0  | 1  | 0  |
| 0  | 0  | 0  | 0  | 0  | 0  | 0  | 1  | 0  | 0  | 0  | 0  | 0  | 0  | 0  | 1  |

Here, x in Table 1 indicates "don't care".

Figure 12:
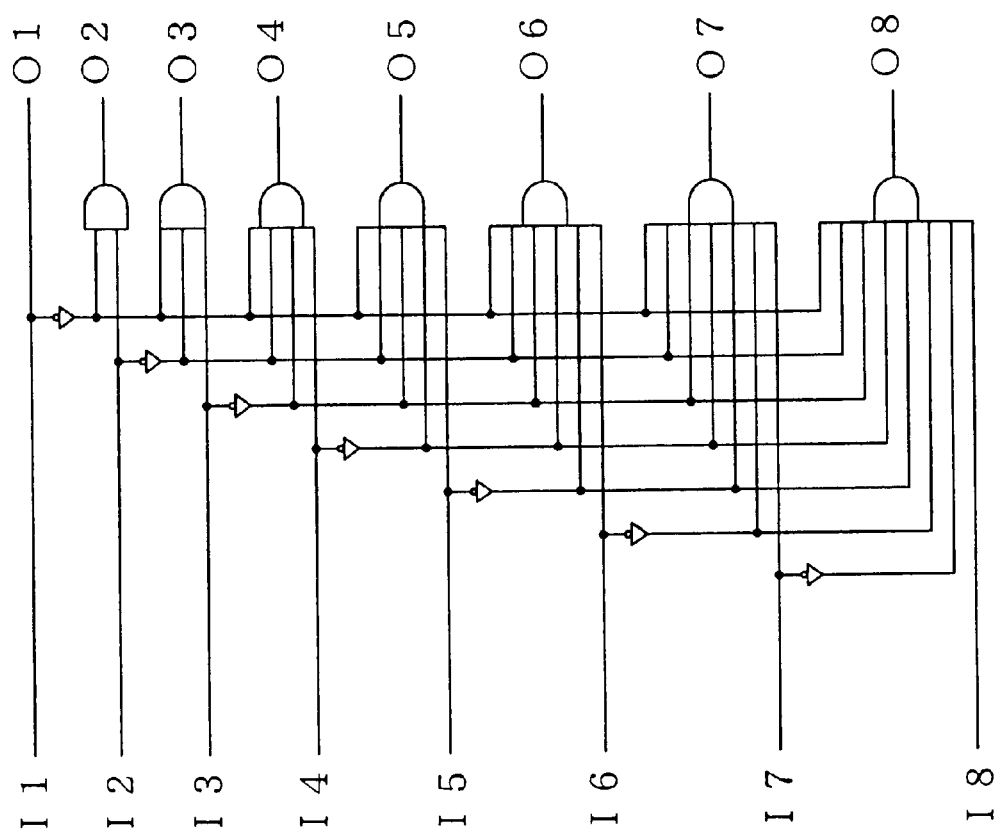
FIG. 12 is a circuit diagram showing an example of a logic circuit applied in a different embodiment from that of the first embodiment.

FIG. 12 shows a case where the table of truth value shown in Table 1 is simply turn into a logic circuit. Accordingly, by applying such a logic circuit, speed-up of processing can be realized.

Second Embodiment

In the above-described first embodiment, description has been given of an example corresponding to the first and second aspects of the present invention. In a second embodiment, description will be given of an example corresponding to third to sixth aspects. With the exception of a portion that illuminates the light source portion for full-color image formation in the controller 202 of the second embodiment, the structure and operation of portions in the second embodiment are the same as those described in the first embodiment. Therefore, description thereof will be omitted. Moreover, in the second embodiment, a case in which the time resolution of a pulse width modulation circuit described later is 256 (0 to 255, 8-bit structure), a number of channels is 8, and a number of channels that can initiate pulse output of the PWM signals at substantially the same time is 1 will be described as an example.

First, a structure of a portion for lighting up the light source portion for full-color image formation 204 in the controller 202 of the second embodiment, that is, the structure of a portion that includes a portion corresponding to a multi-channel pulse width modulation apparatus according to the third to fifth aspects, will be described in detail with referring to FIG. 15.

Figure 15:
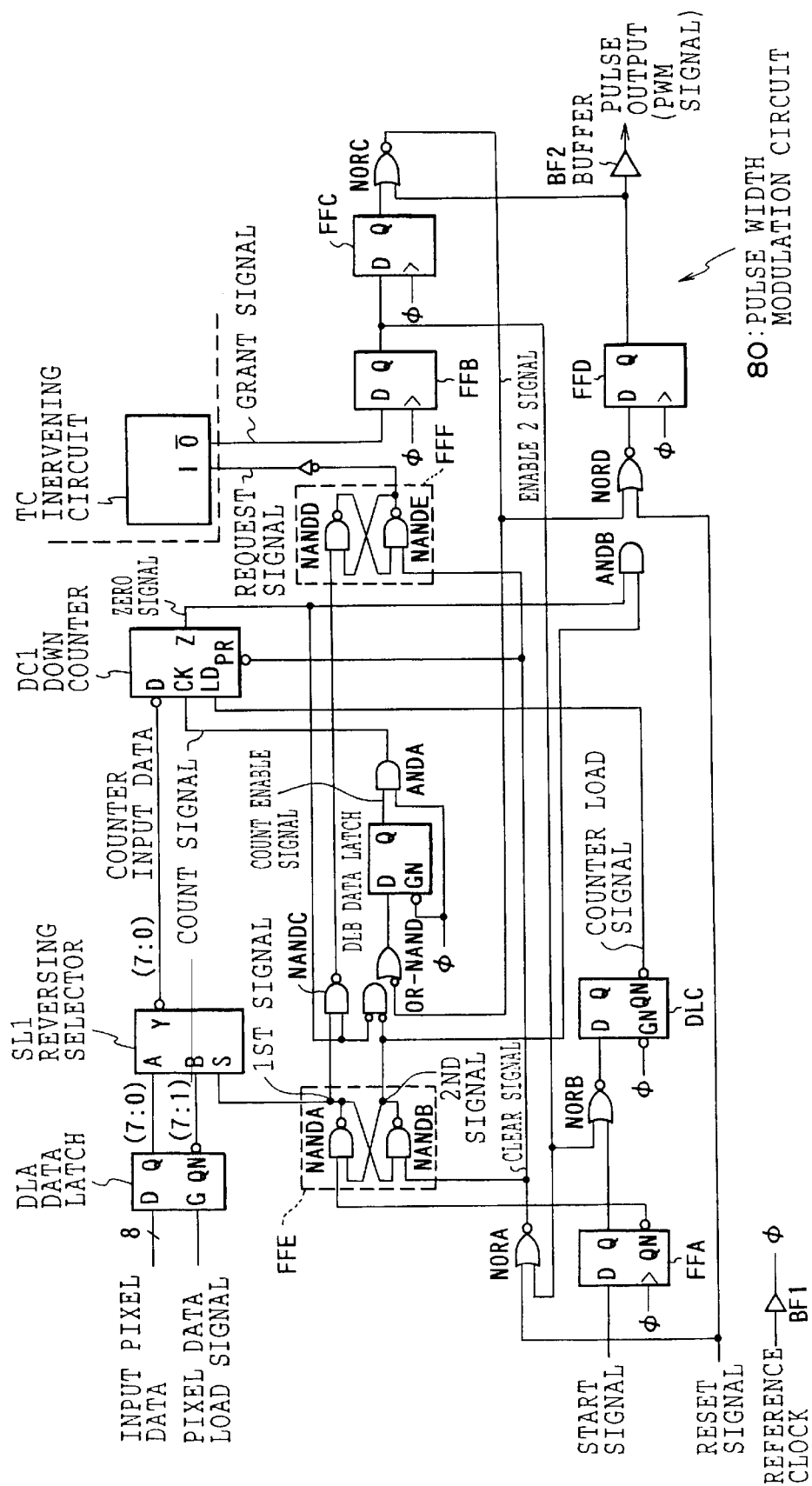
FIG. 15 is a circuit diagram showing a circuit structure of a portion which lights up a light source portion in a controller according to a second embodiment.

In FIG. 15, a pulse width modulation circuit 80 for only one channel is shown, but actually eight similar pulse width modulation circuits are provided. Also, though not shown, the controller 202 is provided with a CPU 10 and a data separator 12 similar to those in the controller 202 according to the first embodiment (see also FIG. 7). The controller 202 is structured such that it reads image data from the CD-ROM 102 or floppy disc 104, and inputs the data in the data separator 12. The inputted image data is corrected by the CPU 10 on the basis of correction values inputted from the light amount correction unit 230, as well as being divided for each LED chip by the data separator 12, and is output to the corresponding pulse width modulation circuit 80 as pixel data (in the present embodiment, 8-bit structure).

As shown in FIG. 15, the pulse width modulation circuit 80 according to the second embodiment has three data latches DLA, DLB and DLC; four D-type flip flops FFA, FFB, FFC and FFD; flip flops FFE and FFF respectively comprising two two-input and one output NAND gates (NANDA, NANDB and NANDD, NANDE); a reversing selector SL1; a down counter DC1; and various gate elements.

The reference clock that becomes a reference for the generation timing of the PWM signal by the pulse width modulation circuit 80 according to the second embodiment is provided by the CPU 10 according to the second embodiment. However, the reference clock is so structured as to act via a buffer BF1 so that it can be used in a plurality of places, and the reference clock via the buffer BF1 is denoted as reference clock φ in FIG. 15.

Moreover, various input signals (pixel data load signal, start signal, reset signal) other than the reference clock to the pulse width modulation circuit 80 shown in FIG. 15 are also generated by the CPU 10, and the CPU 10 inputs the various input signals to the respective pulse width modulation circuits 80 for 8 channels.

The controller 202 according to the second embodiment is also provided with an intervening circuit TC for deciding the relation between the request signal and the grant signal, which is described later. Only one intervening circuit TC is provided in the controller 202 according to the second embodiment, and a single intervening circuit TC corresponds to the pulse width modulation circuits 80 for each channel (in the present embodiment, 8 channels).

In other words, this intervening circuit TC is structured as shown in FIG. 12, and request signals for eight channels output for eight pulse width modulation circuits 80 are respectively input as the input signals I1 to I8.

The intervening circuit TC is structured as a priority circuit, and when the input signal I1 becomes active (high level), the corresponding output signal O1 becomes unconditionally active (high level). However, even if the corresponding input signal I2 becomes high level, the output signal O2 cannot become high level, unless the input signal I1 becomes low level. In other words, it means that the input signal I1 has a higher priority level than the input signal I2.

Similarly, the output signal O3 becomes high level only when both of the input signal I1 and the input signal I2 are low level, and the input signal I3 is high level. Similarly, the output signal O8 becomes high level only when all of the input signals I1, I2, . . . , I7 are low level, and the input signal I8 is high level. In other words, with this intervening circuit TC, even if a plurality of input signals, of the eight input signals I1, I2, . . . , I8, become active (high level), only one of the eight output signals O1, O2, . . . , O8 can become active, and the priority level thereof is I1>I2> . . . >I8.

The structure of the down counter DC1 according to the present embodiment will now be described, with reference to FIG. 16.

Figure 16:
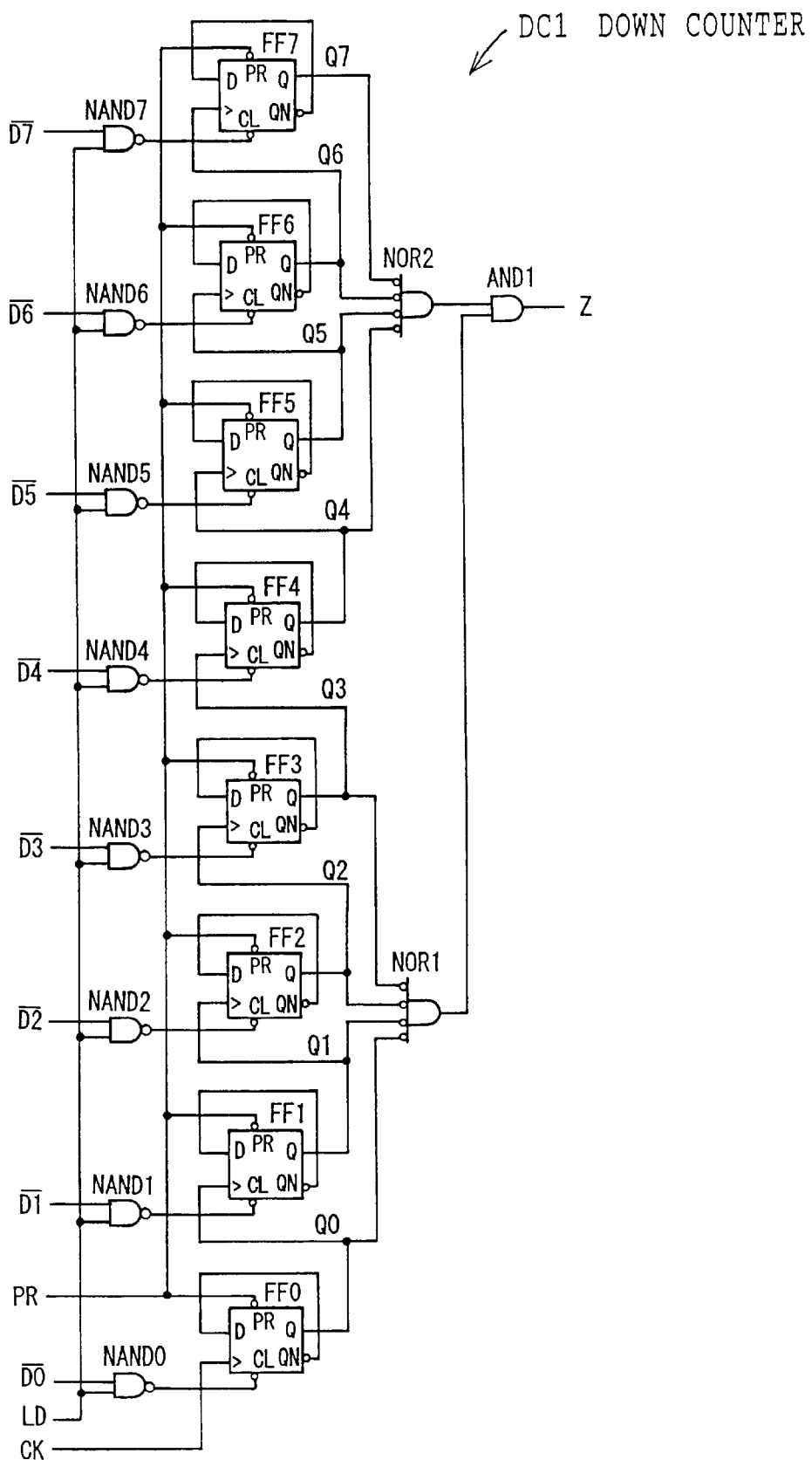
FIG. 16 is a circuit diagram showing a circuit structure of a down counter according to the second embodiment.

As shown in FIG. 16, the down counter DC1 according to the second embodiment has: eight D-type flip flops FF0 to FF7 respectively provided with preset terminals PR and clear terminals CL; eight two-input and one-output NAND gates NAND0 to NAND7 provided for loading the 8-bit pixel data; and four-input and one-output NOR gates NOR1, NOR2 respectively provided for detecting that Q terminal outputs Q0 to Q7 in the respective D-type flip flops FF0 to FF7 become all 0 (zero) and outputting a zero signal, and two-input and one-output AND gate AND1.

The pulse width modulation circuit 80 corresponds to the pulse width modulation signal generation section of the present invention, the intervening circuit TC corresponds to the intervening section of the present invention, the request signal corresponds to the request signal of the present invention, the grant signal corresponds to the enabling signal of the present invention, the down counter DC1 corresponds to the down counter of the present invention, the data latch DLA and the connection from the data latch DLA to the reversing selector SL1 correspond to the conversion portion of the present invention, and the D-type flip flop FFD corresponds to the pulse generation section of the present invention.

Figure 19:
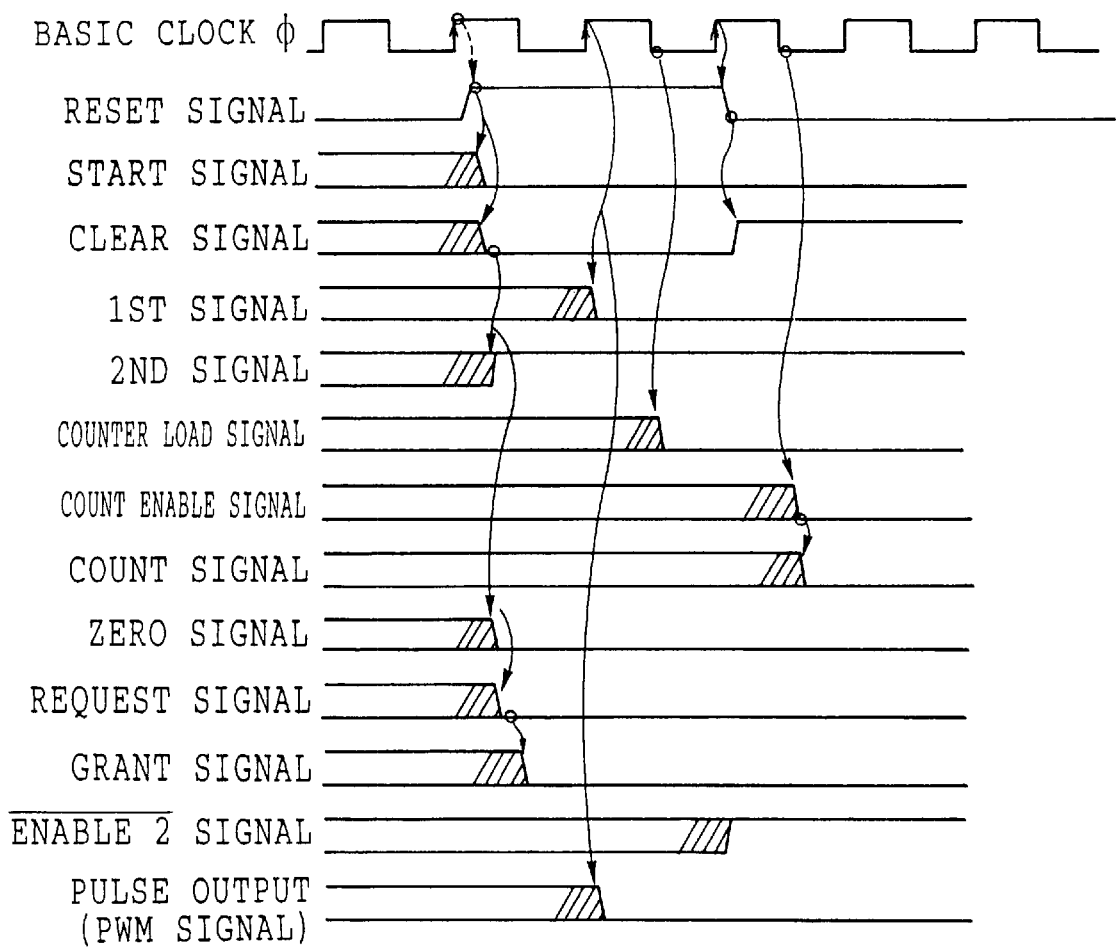
FIG. 19 is a timing chart showing an operating state of various signals in a main part of a pulse width modulation circuit at a time of resetting in the second embodiment.

The operation of the controller 202 structured as described above will now be described. At first, various signal conditions in the main part of the pulse width modulation circuit 80 after reset release will be described, with reference to FIG. 19. FIG. 19 is a timing chart showing an operating condition of various signals in the main part of the pulse width modulation circuit 80 at the time of resetting.

After the power is turned on, signals other than the reset signal are unstable. In FIG. 19, it is shown that after the power is turned on, the reset signal becomes active (high level) at a timing of pulse 1 of the reference clock φ, but normally the respective signal condition is fixed at an earlier stage, since power on reset is done. Here, in view of explanation, there is shown a case where the reset signal is inputted at a slow timing. The respective signal conditions shown in FIG. 19 are the same as those of when the operation of the circuit becomes abnormal and reset is done.

When the reset signal is made active (high level), the start signal showing the start of the exposure operation that is generated by the CPU 10 is made non-active (low level). The clear signal, being an output of the NOR gate NORA is also made active (low level), to thereby start initialization of the pulse width modulation circuit 80. Since the output of the NOR gate NORD also becomes low level, the PWM signal becomes non-active (low level) at the leading edge of the next pulse 2 of the reference clock φ.

When the clear signal becomes low level, the 2ND signal, being the output signal of the one side of the flip flop FFE formed of two NAND gates, NANDA and NANDB, becomes high level. The 1ST signal, being the output signal of the other side of the flip flop FFE becomes low level at a start timing of the pulse 2 of the reference clock φ), at the time when the output of the flip flop FFA which is latching the start signal becomes stable.

Moreover, since the preset terminal PR of the eight-bit down counter DC1 becomes active, the inside of the counter DC1 is initialized to be x 'FF' (hexadecimal notation 'FF'), and the zero signal which is made active (high level) when the count value becomes 0 (zero) also becomes low level.

The request signal, being an exposure start request signal, also becomes non-active (low level), and as a result, the grant signal, being the exposure start grant signal, becomes non-active (low level).

On the other hand, the enable 2 signal serving as the origin of the count enable signal of the down counter DC1 is made non-active (high level) at the start of pulse 3 of the reference clock φ, and hence the count enable signal becomes stable at the trailing edge of pulse 3 of the reference clock φ. However, even if the count enable signal is unstable, actually it is not oscillating, and it is either in the high level or low level state, and thus it means that the count signal is output or not output at the timing of pulse 3 of the reference clock φ). Even if the count pulse is output, the preset signal of the down counter DC1 is still effective at the time of start of the pulse 3 of the reference clock φ, and hence the count value is still x 'FF'. For this purpose, it is necessary that the preset signal of the down counter DC1 is made non-active after startup of the count clock.

The situation when the initialization of the pulse width modulation circuit 80 is completed is similar to the situation when the pulse output of the PWM signal is completed. In other words, it is such a situation that the value of the down counter DC1 is x 'FF' and the zero signal is low level, 2ND signal of the flip flop FFE is high level, the count enable signal is non-active, and the request signal, being the exposure start request signal is also non-active.

Figure 20:
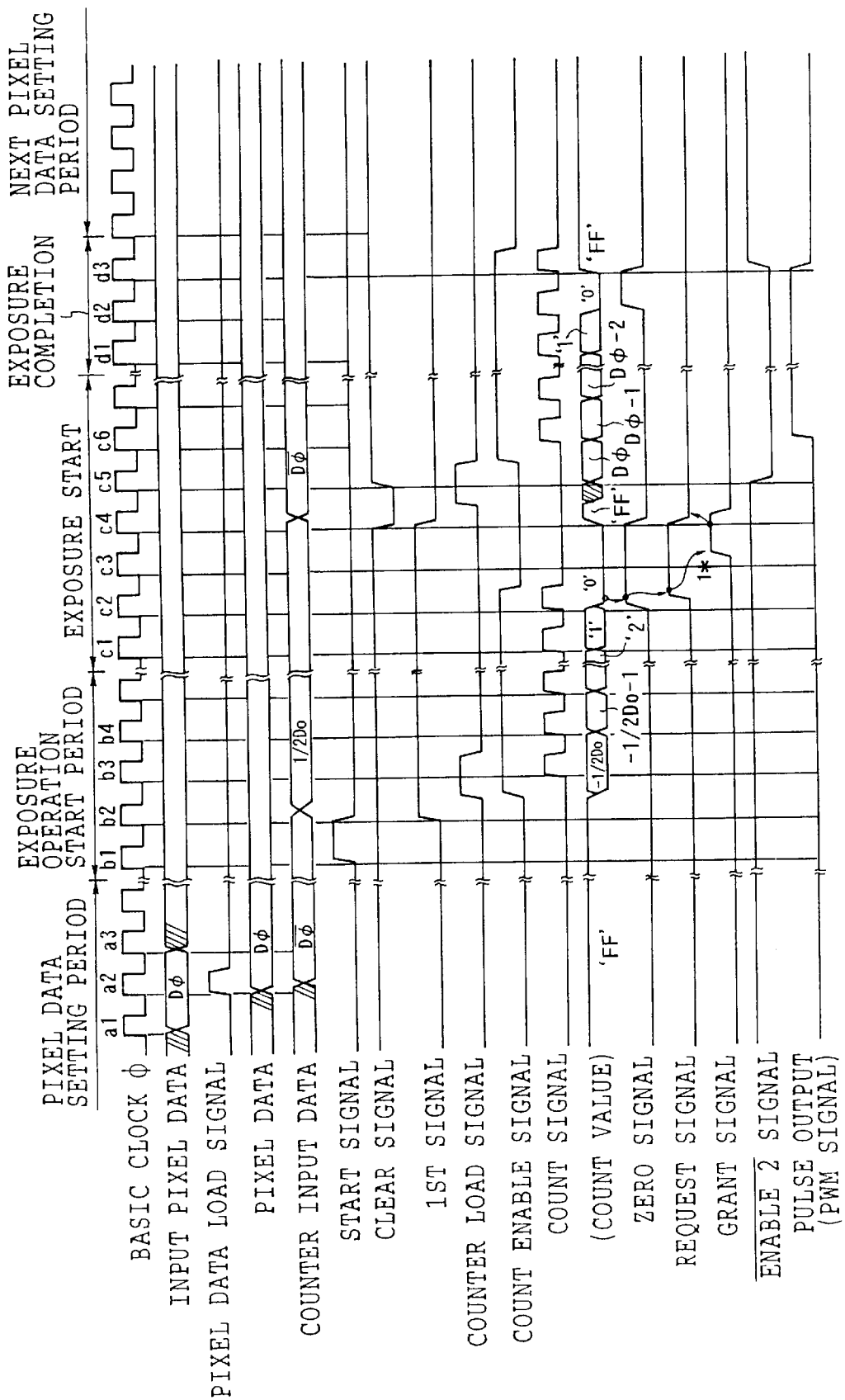
FIG. 20 is a timing chart showing an operating state of various signals in the main part of the pulse width modulation circuit at a time of generating a PWM signal in the second embodiment.

The operation of the pulse width modulation circuit 80 at the time of generating the PWM signal will now be described, with reference to FIG. 20. FIG. 20 is a timing chart showing an operating condition of various signals in the main part of the pulse width modulation circuit 80 at the time of generating the PWM signal.

In the timing chart shown in FIG. 20, four operations, that is, "pixel data setting period", "exposure operation start period", "exposure start" and "exposure completion" are shown. These operations will be described below in order.

In the "pixel data setting period", 8-bit pixel data which decides the exposure period is written in the 8-bit data latch DLA which holds the pixel data. When the input pixel data becomes effective at pulse a1 of the reference clock φ, the pixel data load signal in the data latch DLA becomes active (high level) at pulse a2 of the reference clock φ, thereby the pixel data is taken into the data latch DLA. In FIG. 20, it is shown that the pixel data and the pixel data load signal change synchronously to the reference clock 4 for ease of understanding, however, the pixel data has only to be fixed before the start signal, being the exposure start signal, becomes active. Accordingly, it is not always necessary that these signals are synchronous to the reference clock φ.

The pixel data stored in the data latch DLA is selected by the two-input reversing selector SL1 and becomes reverse input data of the down counter DC1. Below is a description of the operation of this portion.

When the select input signal S, that is, the 1ST signal in the reversing selector SL1 is low level, that is, in the reset release condition, A input is selected, and hence the reverse data of the pixel data is inputted to the data input terminal D of the down counter DC1. If the load signal in the down counter DC1 is made active in this state, the value of the pixel data is directly set in the down counter DC1.

On the other hand, when the select input signal S is high level, the "value obtained by reversing the pixel data and shifting it to the right by one bit" is set in the down counter DC1. Reversing of the pixel data is realized by using an output signal of the QN terminal of the data latch LDA, and one-bit right shift is realized by the connection with the reversing selector SL1. Below is a description of the above-described "value obtained by reversing the pixel data and shifting it to the right by one bit".

Figure 13:
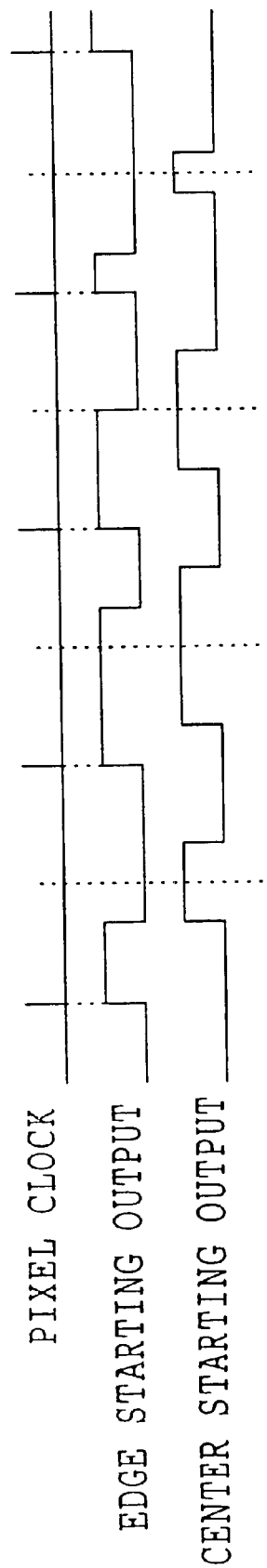
FIG. 13 is a timing chart used for an explanation of related art.
Figure 14A:
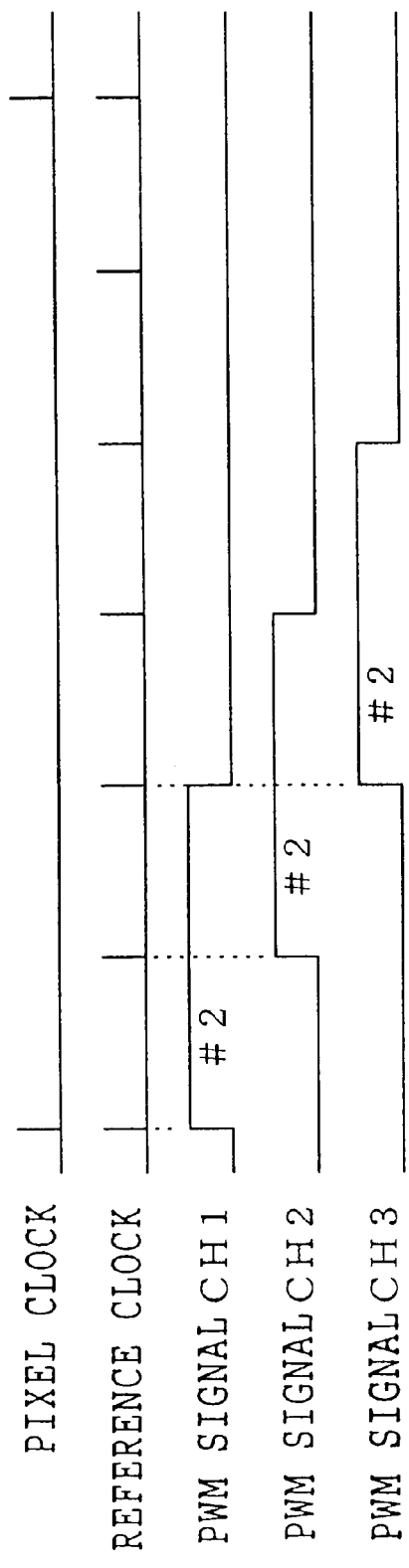
FIGS. 14A and 14B are timing charts used for an explanation of problems in the related art.
Figure 14B:
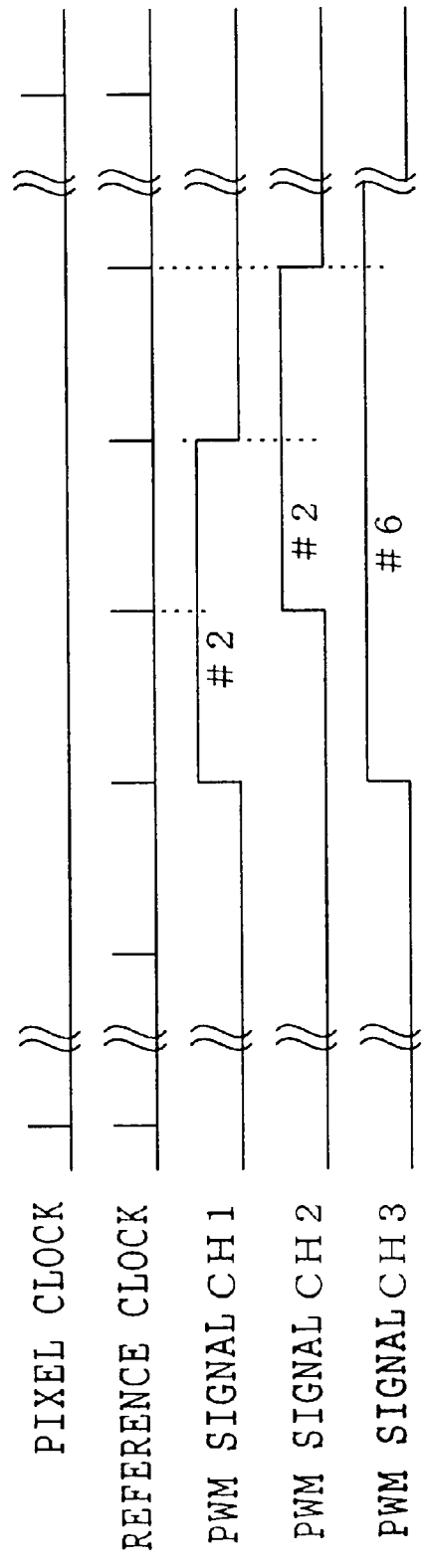

As shown in the waveform of the center starting output in FIG. 13, what is intended to be output as a PWM signal is "pulse output with a pulse width corresponding to the pixel data, wherein the central position (vicinity) between each pulse of the pixel clock is designated as the center". In this case, if a point of time when the pixel clock arrives is assumed to be time 0 (zero), the "pulse output start time" is a time obtained by subtracting a time corresponding to the half of the output pulse width from a time up to the center of the pixel clock. The time up to the center of the pixel clock in the present embodiment is expressed by:

(pixel clock interval~maximum value of the pixel data=x 'FF')÷2=x'7F', and half of the output pulse width is expressed by (pixel data)÷2.

Accordingly, the start time T of the pulse output is expressed by:

$$T=x‘7F’-(pixel\ data)\div 2 \qquad (1)$$

Since x '7F' and (pixel data)÷2 are both 7-bit data, considering in the seven bit range, the right side in the above expression (1) represents complement of 1 in the data, that is, (pixel data)÷2. Hence, T can be obtained by simply reversing the data, without executing the subtraction.

On the other hand, halving the (pixel data) is the same as one-bit right shift of the pixel data. Also, with regard to reversion and shift of data, the results are the same even if either one is executed first. As a result, the "value obtained by reversing the pixel data and shifting it to the right by one bit" represents the exposure start time T.

Specifically showing this, for example, if the pixel data is assumed to be x '1A', this is '26' in the decimal notation. Since up to the center of the pixel clock is half of '255', that is, '127', the start time of pulse output is 127−26÷2=114, which becomes x '72', if it is expressed by the hexadecimal notation. On the other hand, if x '1A' is reversed, it becomes x 'E5', and if it is shifted to the right by one bit, it becomes x '72', which is the same value as the calculation result of the above expression (1).

Since this data has only 7 bits, it is necessary to supplement 0 (zero) in the most significant in order to load it to the down counter DC1 having the 8-bit structure. Accordingly, the most significant bit of the B input of the reversing selector SL1 is fixed to 0.

With the description provided up until now, doubts may surface as to whether the central position of the pulse output (PWM signal) is shifted from the center of the pixel clock, since the pixel clock interval is generally made larger than the maximum value of the pixel data, or what will happen to the least significant bit when the data is shifted to the right by one bit. However, these doubts do not become a problem with the application for which the present invention is intended. This is because a main object of the multi-channel pulse width modulation apparatus of the present invention is to prevent pulse outputs of the PWM signals from exceeding a predetermined number and starting at substantially the same time. For that purpose, start of the output is delayed, and when there are pulse outputs in eight channels as in the present embodiment, there is a possibility that the output may be delayed by 7 clocks at maximum. In other words, even if the central position of the pulse output varies to this extent, it does not affect the image quality.

When the pixel data is stored in the data latch DLA, it waits until the start signal, being a signal showing the exposure start timing, becomes active. The start signal is generated by the CPU 10 with a width for one clock of the reference clock φ, synchronously to the pixel clock (see also FIG. 13).

As shown in FIG. 20, when the start signal becomes active (high level) at pulse b1 of the reference clock φ), the 1ST signal becomes high level at pulse b2, and the reversing selector SL1 is changed over so as to select the B input. Therefore, as described above, the input data of the down counter DC1 becomes the "value obtained by reversing the pixel data and shifting it to the right by one bit" which shows the exposure start time T.

If there are a plurality of channels, there may be a case where exposure cannot be immediately performed even at the exposure start time. Therefore, hereinafter, the "value obtained by reversing the pixel data and shifting it to the right by one bit" is referred to as "exposure start request time".

At the trailing edge of pulse b2 of the reference clock φ, the load signal in the down counter DC1 is made active (high level), and the "value obtained by reversing the pixel data and shifting it to the right by one bit" is set in the down counter DC1, and now it is ready to start down count up to the exposure start request time.

When the 2ND signal becomes low level, AND condition on the OR side of the OR-NAND gate "OR-NAND" is released, the count enable signal is made active (high level) from the trailing edge of pulse b2 of the reference clock φ, to thereby start to output the count signal from the pulse b3. However, since at the pulse b3, the load signal of the down counter DC1 is effective, it is from the pulse b4 when count down is started actually. In this manner, the data of the exposure start request time is set in the down counter DC1, and down count is started.

When the count down proceeds, and the count value becomes 0 (zero) at pulse c2 of the reference clock φ, the zero signal is made active (high level), and the output of the NAND gate NANDC is made active (low level). When the output of the NAND gate NANDC is made active, the flip flop FFF formed of the NAND gates NANDD and NANDE is set, and the request signal, being the exposure start request signal, is made active (high level). Moreover, when the zero signal becomes high level, the AND condition in the OR portion of the OR-NAND gate OR-NAND is not satisfied, and the count enable signal becomes non-active (low level) at the trailing edge of the pulse c2 of the reference clock φ. As a result, since then, the count signal becomes also a non-active state. This state continues until the grant signal, being the exposure start grant signal, becomes active (high level). In FIG. 20, there is shown a case where the grant signal is sent back after one clock since the request signal has been issued.

In the timing chart shown in FIG. 20, only the pulse width modulation circuit 80 for one channel is shown, but actually, the pulse width modulation circuits 80 for other seven channels receive the same start signals, and generate the exposure start request signal at the time corresponding to each pixel data.

Here, when there are a plurality of channels in which the exposure start request time is the same, a plurality of request signals become active simultaneously at a timing of pulse c2 of the reference clock φ. If there exists one pulse width modulation circuit 80 having a higher priority level than the pulse width modulation circuit 80 which is the target in FIG. 20, the grant signal is delayed by one clock, as shown in FIG. 20. If the grant signal is delayed, since the exposure start request time becomes different, there is a possibility that it may be matched against another request signal, which is originally not to compete with, and in the channel having a low priority level, there is a possibility that the grant signal is delayed by seven clocks at maximum.

When the grant signal is made active (high level) at a timing of pulse c3 of the reference clock φ, the clear signal is made active (low level) at a timing of pulse c4, to thereby preset the down counter DC1. Hence, the zero signal becomes non-active (low level), and the request signal also becomes non-active (low level), the 1ST signal becomes low level, and the output data of the reversing selector SL1 is changed over to the pixel data.

Thereafter, the load signal of the down counter DC1 is made active at the trailing edge of pulse c4 in the reference clock φ. During the period when the pulse c4 is low level, both of the load signal and the preset signal of the down counter DC1 become active, the operation of this part will be described later.

At the leading edge of pulse c5 of the reference clock φ, the preset signal becomes non-active, and even at this point of time, since the load signal is effective, the pixel data is eventually set in the down counter DC1. At the leading edge of pulse c5, since the enable 2 signal becomes active (low level), all of the input signals of the NOR gate NORD become low level, and at the leading edge of pulse c6, the Q terminal output of the flip flop FFD becomes high level, and the pulse output (PWM signal) becomes active (high level).

When the Q terminal output of the flip flop FFD becomes high level, the output of the NOR gate NORC becomes low level, and hence the enable 2 signal keeps the active state. This continues until the output of the AND gate ANDB becomes high level.

When the enable 2 signal becomes active at the leading edge of pulse c5 of the reference clock φ, the count enable signal becomes active at the trailing edge of pulse c5, and the count signal becomes active from pulse c6, to thereby start down count by the down counter DC1. After this, since the value of the data latch DCA is not used, it is possible to rewrite the pixel data at an optional time.

When down count by the down counter DC1 proceeds, and the count value becomes 0 (zero) at the leading edge of pulse d2 of the reference clock, the zero signal becomes active (high level). In this case, since the 1ST signal is low level, the request signal is not output. Instead, since the 2ND signal is high level, the AND condition of the AND gate ANDB is released, and the output becomes high level. Then, the output of the NOR gate NORD becomes low level, and hence the Q terminal output of the flip flop FFD becomes low level, to thereby complete the pulse output of the PWM signal.

Moreover, since both inputs of the NOR gate NORC become low level, the enable 2 signal becomes non-active, and the count enable signal becomes non-active at the trailing edge of pulse d3. Since the count signal becomes active even at the time of pulse d3, the down counter DC1 becomes x 'FF' from x '00', and the zero signal becomes non-active (low level). This completes the series of operation, and returns to the same condition as that of after reset release.

From the above description, characteristics of the present embodiment can be extracted as follows.

One down counter DC1 is used for both of counting up to the exposure start request time, and counting of the exposure time.

The exposure start request time data is formed by reversing the image data and shifting the data to the right by one bit.

The circuit condition is frozen until the exposure start grant signal arrives, by stopping the clock of the down counter DC1, and it can wait as much time as it is desired. In other words, it does not depend on the number of pulse width modulation circuits (the number of channels).

The down counter DC1 particularly related to the present invention will now be described. The down counter DC1 according to the present embodiment is an asynchronous (ripple carry) type down counter, hence in general there is a worry about the count speed. When the count speed is important, a synchronous counter is generally used. However, the synchronous counter has a large number of transistors, and there are lots of signals which vary for each clock, and hence it is disadvantageous than the asynchronous counter in view of power consumption and noise. Since the down counter used in the present invention is required for the number of channels, it is desired that the power consumption and generated noise be as little as possible. Therefore, in the present invention, an asynchronous counter is applied. The count speed at this time will now be described.

Figure 21:
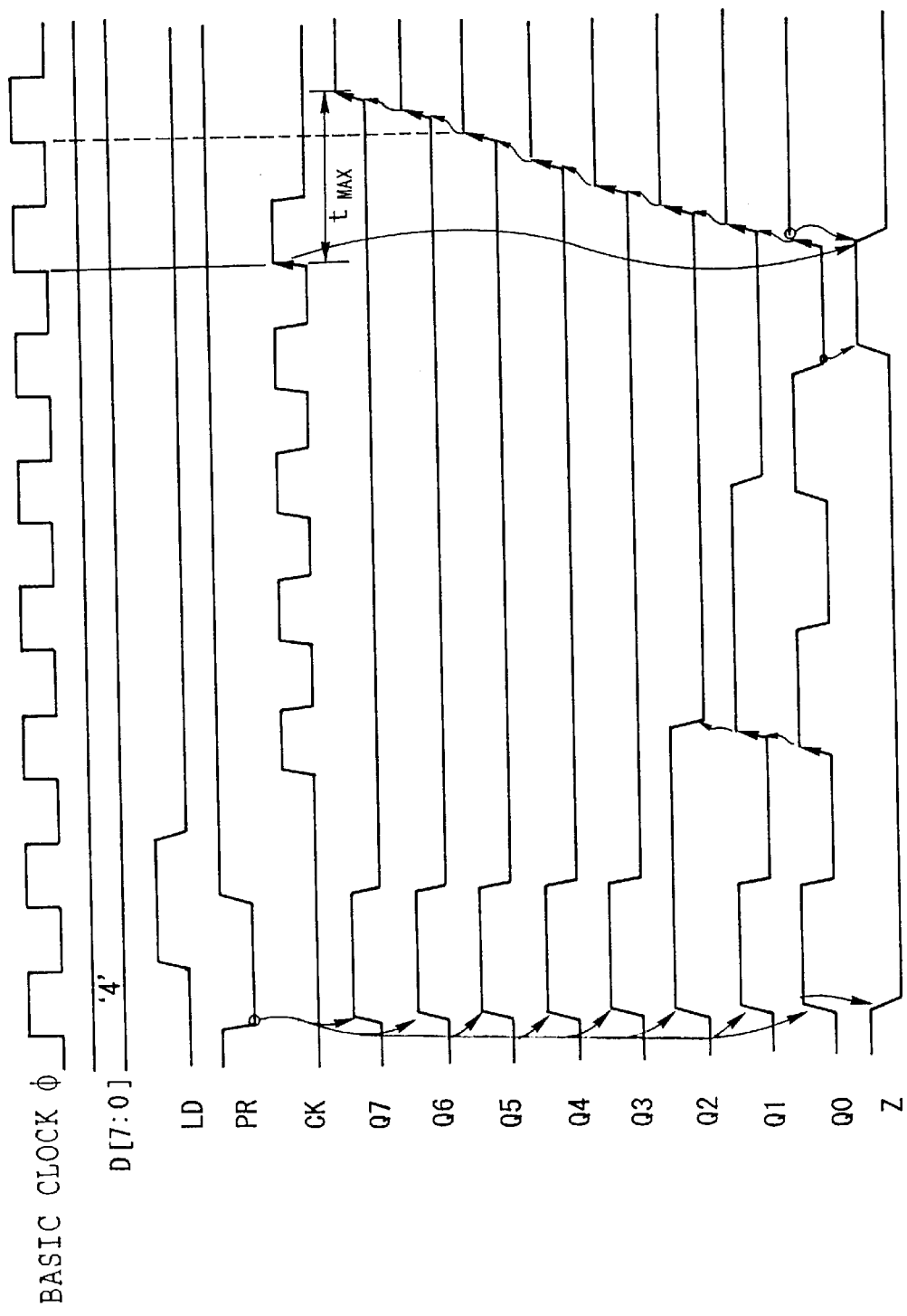
FIG. 21 is a timing chart showing an example of an operating state of various signals in a main part of the down counter in the second embodiment.

In FIG. 21, there is shown a timing chart showing an example of an operating condition of various signals in the main part of a down counter DC1 according to the present embodiment. As shown in this figure, with the asynchronous down counter DC1 according to the present embodiment, when a Q terminal output of a certain bit becomes "1", the upper bit thereof is reversed. Accordingly, the time when the count speed becomes slowest is when the count value is changed from x '00' to x 'FF'. FIG. 21 shows an example of this case. The Q7 terminal output is fixed last, and if this value is not fixed within one clock, normally a problem occurs (in FIG. 21, it is shown a case where it is not fixed within one clock).

With the way to use the down counter in the present invention, the value of the Q7 terminal output is not required, and only the zero signal is necessary. When the Q0 terminal output becomes high level, the output of the NOR gate NOR1 becomes low level, and when the output of the NOR gate NOR1 becomes low level, the zero signal, being an output signal of the AND gate AND1, becomes non-active (low level). In other words, no matter how much fixation of the upper level digit may be delayed, it will not affect the zero signal. This situation is also applied to the case where the zero signal becomes active (high level).

The zero signal changes when the count value changes from x '01' to x '00'. In this case, the values of from Q1 to Q7 have been already fixed to 0 (zero), and only the Q0 terminal output changes from '1' to '0'. In other words, the signal delay time of the zero signal is decided by the delayed condition in the Q0 terminal which is the least significant bit, and the time when the values of the upper level digits are fixed does not affect it at all. In the present embodiment, the description is made of a case of a down counter having the 8-bit structure. However, if the number of bits of the down counter is increased or the frequency of the reference clock φ is increased in order to increase the resolution of the output pulse width of the PWM signal, there may be a case where the count value is not fixed within one clock of the reference clock φ. However, by utilizing only the zero signal as in the present embodiment, the asynchronous type down counter can be used.

With the down counter DC1 according to the present embodiment, the data is loadable, but the down counter DC1 has a different structure as that of a counter generally used.

Figure 17:
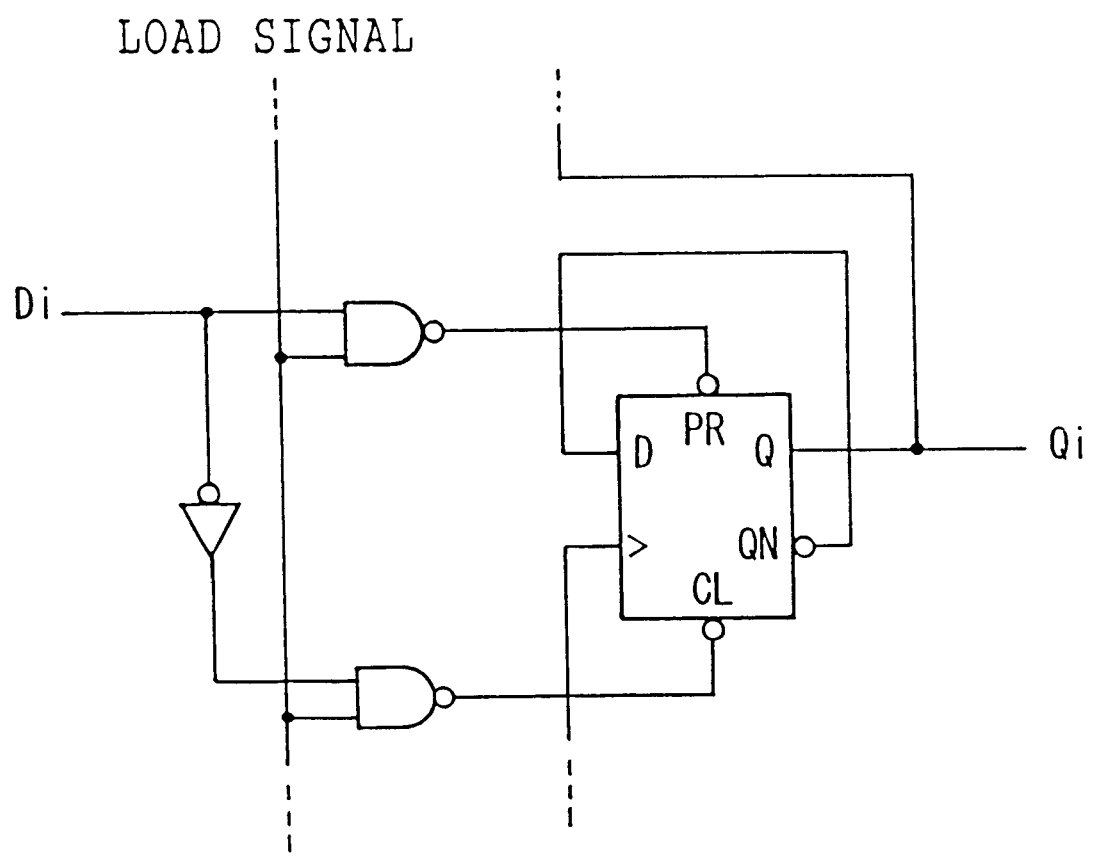
FIG. 17 is a circuit diagram showing an example of a circuit structure of a conventional down counter.

FIG. 17 shows an example of a circuit structure of a generally used asynchronous loadable down counter, only for one bit. With this circuit, a two-input NAND gate is respectively connected to a preset terminal PR and a clear terminal CL of a D-type flip flop. A load signal is inputted to a one side input terminal of the respective NAND gate, data signal Di is inputted to the other side input terminal of the NAND gate connected to the preset terminal PR, and a reverse signal of the data signal Di is inputted to the other side input terminal of the NAND gate connected to the clear terminal CL. With this circuit, when the load signal becomes active (high level), and when the data signal Di is '1' (high level), the preset signal becomes active (low level), and when the data signal Di is '0' (low level), the clear signal becomes active (low level), and hence the data is precisely set in the D-type flip flop. However, with this circuit, two NAND gates and one inverter are required in order to set the data. For example, when this circuit is applied to a down counter having an eight-bit structure, there is such a problem that 16 NAND gates and 8 inverters are required, and these are necessary for the number of channels.

Figure 18:
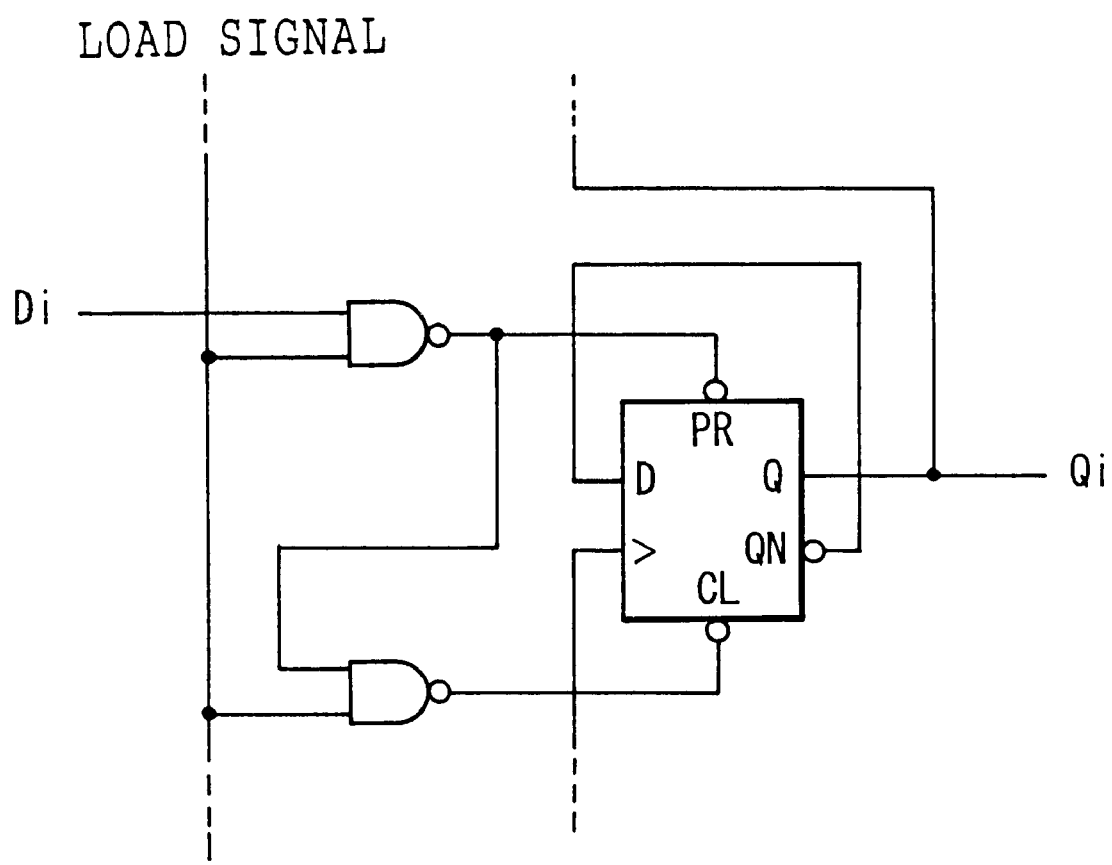
FIG. 18 is a circuit diagram showing another example of a circuit structure of a conventional down counter.

On the other hand, FIG. 18 shows an example of a circuit structure of a counter in which the necessary number of transistors is slightly reduced from the circuit shown in FIG. 17. This circuit is structured such that the preset signal is inputted to the other side input terminal of the NAND gate connected to the clear terminal CL. In this circuit, when the load signal becomes active, and when the data signal Di is '1' (high level), the preset signal becomes active (low level), and then the clear signal becomes non-active (high level), to thereby set '1' in the D-type flip flop. When the data signal Di is '0' (low level), since the preset signal remains non-active (high level), the clear signal becomes active (low level), to thereby set '0' in the D-type flip flop. In this manner, in either case, data can be precisely set in the D-type flip flop. However, when the data signal Di is '1', a short pulse is generated in the clear signal, and hence, according to circumstances, noise may occur in the output of the D-type flip flop, causing a problem in the circuit operation, and since two NAND gates are used for each one bit, there is a problem in this case in that the number of transistors to be used increases.

On the contrary, with the down counter DC1 according to the present embodiment shown in FIG. 16, since the preset terminal PR of the D-type flip flops FF0 to FF7 corresponding to each digit is made common, it is structured such that preset is inputted at the same time to each flip flop, a two-input NAND gate is connected only to the clear terminal CL, a load signal is inputted to one side input terminal of the NAND gate, and a reverse signal of the data is inputted to the other side input terminal. Accordingly, the NAND gate required for one bit of the down counter DC1 according to the present invention is only one, providing a structure suitable to the multi-channel pulse width modulation apparatus.

The operation when data is loaded into the down counter DC1 in the present embodiment will now be described. In the present embodiment, the time when data is loaded into the down counter DC1 is at the time of resetting, at a timing of pulse b2 of the reference clock φ in FIG. 20, and at a timing of pulse c4 and pulse c5.

At first, at the time of resetting, only the preset signal becomes active, and the load signal is non-active, and hence all of the D-type flip flops FF0 to FF7 are set to '1' without any problem.

When the load signal becomes active at the trailing edge of pulse b2 of the reference clock φ, only a clear signal of a bit where the pixel data is '0' becomes active (low level), to thereby set the D-type flip flop to '0'. In the bit where the pixel data is '1', the preset signal and the clear signal are both non-active (high level). Since in the condition immediately before, all the D-type flip flops are '1', the condition of the D-type flip flop is '1' as it is, in the bit where the pixel data is '1', and as a result, when the load signal comes in, the data is to be precisely set.

Next, when the preset signal becomes active (low level) at the leading edge of pulse c4 of the reference clock φ, all the D-type flip flops are set to '1'. When the load signal becomes active at the leading edge of pulse c4, since the clear signal is non-active in the bit where the pixel data is '1', the D-type flip flop remains being set to '1', and in the bit where the pixel data is '0', the preset signal and the clear signal become active at the same time. The operation of the D-type flip flop differs according to the structure of the flip flop, when the preset signal and the clear signal become active. However, if a flip flop in which the Q terminal output is '1' is chosen, the zero signal remains being fixed to be non-active (low level). When the preset signal becomes non-active at the leading edge of pulse c5 of the reference clock φ, since only the load signal is active, accurate data is eventually set in the D-type flip flop.

In other words, as a loadable down counter used in the present embodiment, the down counter DC1 having a structure as shown in FIG. 16 can be utilized, and according to the down counter in the present embodiment shown in this figure, the down counter can be structured with a few number of transistors, and it is advantageous in view of power consumption and generated noise, and having an effect that the operation frequency is not deteriorated even if the number of bits of the counter is increased.

As described above, with the controller 202 as the multi-channel pulse width modulation apparatus according to the present embodiment, in the request signal output from a plurality of pulse width modulation circuits, when the number of request signals which become effective at substantially the same time exceeds a predetermined number (in the present embodiment, 1), a grant signal showing permission to start the generation of the pulse width modulation signal is output to the pulse width modulation circuit in a number no greater than the predetermined number. Hence, the number of pulse width modulation signals that become effective at substantially the same time can be made no greater than the predetermined number, thereby enabling prevention of decrease in the operational reliability due to the pulse width modulation signals being made effective at substantially the same time.

Also with the controller 202 according to the present embodiment, since the grant signal is output in a predetermined order of priority, it can be set such that the pulse width modulation signals are not made effective at substantially the same time. As a result, it can be reliably prevented that the operational reliability decreases due to the pulse width modulation signals being made effective at substantially the same time.

Moreover, with the controller 202 according to the present embodiment, since the pulse width modulation signal is generated by obtaining data in which complement of 1 in the pixel data showing the pulse width of the pulse width modulation signal to be generated (reverse data) is shifted to the right by one bit, starting the output of the pulse width modulation signal after counting the time course corresponding to the data, and stopping the output of the pulse width modulation signal after counting the time course corresponding to the pixel data, the pulse width modulation signal can be obtained easily and in a short period of time.

According to the down counter in the present embodiment, preset terminals of a plurality of D-type flip flops included in the down counter are connected to a single preset input terminal, to thereby reduce the AND gates (or the NAND gates) corresponding to the preset terminals conventionally required. As a result, the down counter can be produced at a inexpensive price, and power consumption and noise can be reduced.

In the present embodiment, the description is made of a case where the time resolution of the pulse width modulation circuit is 256 (0 to 255, 8-bit structure), the number of channels is 8, and the number of channels that can at substantially the same time start the pulse output is 1. However, the present invention is not limited thereto, and it is also applicable in an optional application where the time resolution is two or more, the number of channels is also two or more, and the number of pulse output which start at substantially the same time is two or more.

In order to increase the time resolution, respective number of bits of the data latch DLA for latching the image data, the reversing selector SL1, and the down counter DC1 have only to be increased. Of these, the one which is easily affected by the operation speed or the like due to the increase of the number of bits is an asynchronous type down counter DC1. However, as described above, in the present invention, even if the number of bits of the down counter is increased, the operation speed does not decrease. Accordingly, it is easily applicable to applications having various resolutions.

Figure 22:
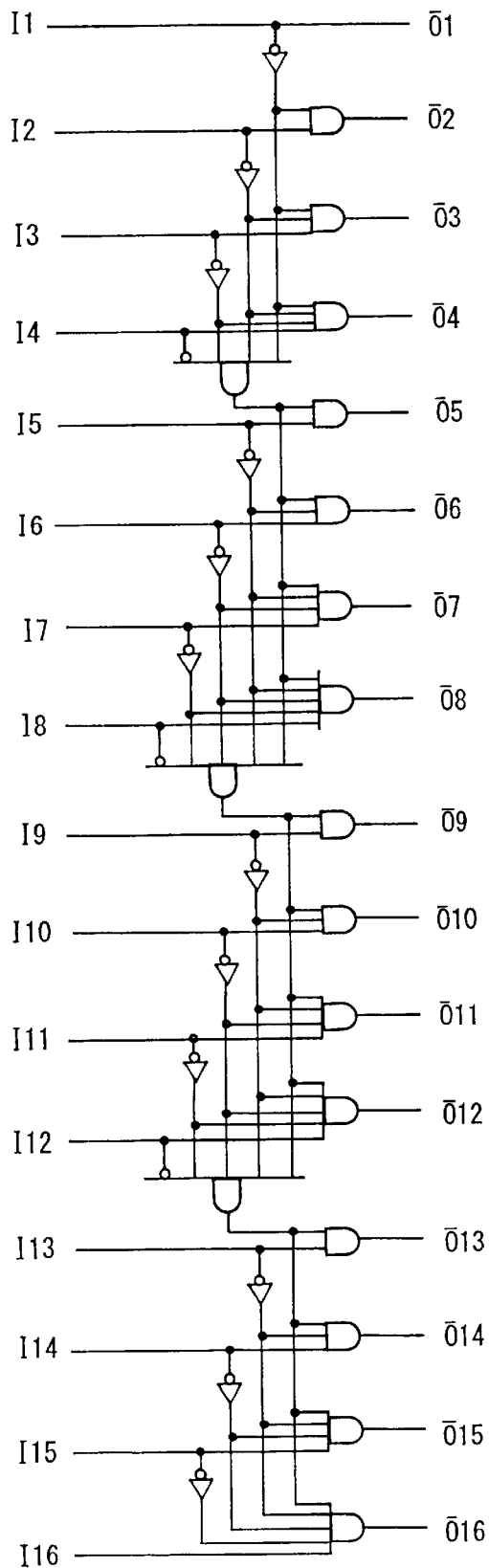
FIG. 22 is a circuit diagram showing an example of a circuit structure of an intervening circuit in a case where there are 16 channels.

When the number of channels is increased, the number of inputs and outputs of the intervening circuit TC increases. This circuit has a simple structure, and is capable of easily corresponding to a multiplicity of channels. For example, FIG. 22 shows an example of a circuit structure where there are 16 channels. In this example of circuit structure, in order to designate the number of input signals to the AND gate which is generating output signals O1 to O16 as 5 or less, the input signals are put together for every four bits, and output as an inhibiting signal to the channel having a low priority level.

In the present embodiment, as the intervening circuit TC, 8-input priority circuit is used. This circuit has an advantage in that the structure is simple and the operation is fast, but on the other hand, it has a disadvantage in that the priority level is predetermined, and the grant signal output simultaneously (exposure start grant signal) is fixed to be one.

Figure 23:
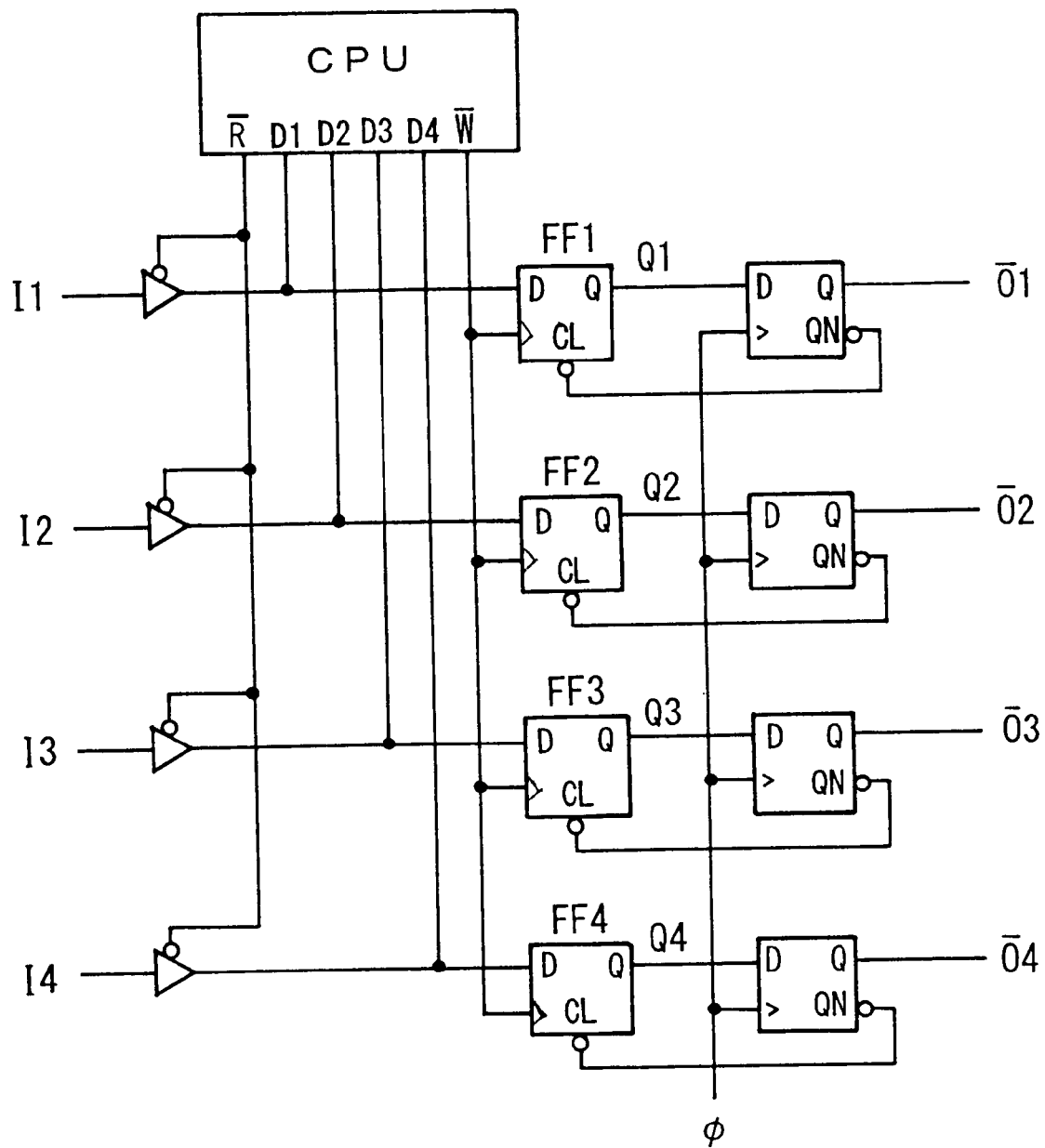
FIG. 23 is a circuit diagram showing an example of a circuit structure where a program-controlled form is applied using a CPU as an intervening circuit.

If it is desired to flexibly change the priority level, or to use a plural number of grant signals output simultaneously, it can be considered to apply a program-controlled mode using a CPU as shown in FIG. 23. FIG. 24 shows a timing chart showing an operating condition of various signals in the main part of the intervening circuit in this case.

The CPU makes an R signal asynchronous to the reference clock φ active (low level) at a suitable timing, and reads the condition of the input signals I1 to I4. This operation corresponds to the vicinity of pulse 3 of the reference clock in FIG. 24. Here, if any one of the input signals I1 to I4 is active (high level), and is outputting a request signal, the CPU makes either terminal of D1 to D4 (one or more) high level according to the program, and makes the write clock W active (low level). Then, either Q terminal output of the D-type flip flops FF1 to FF4 in FIG. 23 (Q1 terminal output in FIG. 24) becomes '1' at a start timing of the write clock W. Since the grant signal is synchronous to the reference clock φ, and should have one clock width, the Q1 terminal output is sampled at pulse 9 of the reference clock, and the Q1 terminal output is cleared immediately after the output signal O1 becomes active (high level). Then, at pulse 10, the output signal O1 becomes low level.

In this manner, the algorithm of intervening can be flexibly changed, using the structure as shown in FIG. 23. However, the circuit structure shown in FIG. 23 has a disadvantage in that there is large time difference since the request signal has been input till the grant signal is output. However, as described above, the pulse width modulation circuit 80 according to the present embodiment can wait as much time as it is necessary, since the request signal has been output till the grant signal is inputted. Therefore, though the central position of the output pulse (PWM signal) varies due to the delay of the grant signal, this delay does not become a problem, so long as this variation does not affect the image quality.

What is claimed is:

1. A multi-channel pulse width modulation apparatus comprising:
a plurality of pulse width modulation signal generators which respectively generate a pulse width modulation signal, and when a timing signal showing a shifted amount of a generation timing of the pulse width modulation signal is inputted thereto, generate a pulse width modulation signal in which the generation timing thereof is shifted corresponding to the timing signal; and
a determination section that determines whether or not the pulse width modulation signals from the plurality of pulse width modulation signal generators exceed a predetermined number and become effective at substantially the same time, and on the basis of the results of the determination, generates the timing signal so that the number of pulse width modulation signals that become effective at substantially the same time becomes no greater than the predetermined number, and outputs the timing signal to a corresponding pulse width modulation signal generation section.

2. A multi-channel pulse width modulation apparatus according to claim 1, wherein on the basis of the results of the determination, the determination section generates the timing signal so that the pulse width modulation signals do not become effective at substantially the same time and outputs the timing signal to the corresponding pulse width modulation signal generators.

3. A multi-channel pulse width modulation apparatus according to claim 1, wherein the predetermined number is 1.

4. A multi-channel pulse width modulation apparatus according to claim 1, wherein the determination section determines whether or not the time at which the pulse width modulation signals become effective is substantially the same, on the basis of one of:
whether or not pulse widths of the pulse width modulation signals that the plurality of pulse width modulation signal generators generate are substantially equivalent; and
whether or not scheduled timings indicated by scheduled timing signals are substantially equivalent, with the scheduled timing signals indicating scheduled timings at which the pulse width modulation signals are generated, and being outputted from each pulse width modulation signal generator to the determination section prior to generation of the pulse width modulation signals.

5. A multi-channel pulse width modulation apparatus comprising:
a plurality of pulse width modulation signal generators that respectively output a request signal requesting permission to initiate generation of a pulse width modulation signal, and that stop the output of the request signal when an enabling signal indicating permission to initiate generation of the pulse width modulation signal is inputted and initiate generation of the pulse width modulation signal; and
an intervening section that outputs enabling signals to corresponding pulse width modulation signal generators when the request signals output from the plurality of pulse width modulation signal generators are inputted and the number of request signals that have become effective at substantially the same time is no greater than a predetermined number, and that outputs enabling signals to a number of pulse width modulation signal generators no greater than the predetermined number when the number of request signals that have become effective at substantially the same time exceeds the predetermined number.

6. A multi-channel pulse width modulation apparatus according to claim 5, wherein the intervening section outputs the enabling signals in a predetermined order of priority.

7. A multi-channel pulse width modulation apparatus according to claim 5, wherein the pulse width modulation signal generators respectively include:

a conversion portion that obtains conversion data in which complement of 1 in a width data indicating a pulse width of a pulse width modulation signal to be generated is shifted to the right by one bit; and a pulse generator that generates the pulse width modulation signal by initiating output of the pulse width modulation signal after an elapse of time corresponding to the conversion data has been calculated and stops output of the pulse width modulation signal after an elapse of time corresponding to the width data has been calculated.

8. A multi-channel pulse width modulation apparatus according to claim 5, wherein the predetermined number has as an upper limit a value within a range in which operational reliability of the apparatus is permitted.

9. A multi-channel pulse width modulation apparatus according to claim 5, wherein the request signal is output continuously.

10. A multi-channel pulse width modulation apparatus according to claim 5, wherein the request signal is output repeatedly for each predetermined time.

11. A down counter comprising:

a plurality of edge trigger type flip flops that are tandem connected and that each have a preset terminal and a clear terminal;

a preset input terminal connected to all of the preset terminals of said plurality of flip flops;

a plurality of two-input AND gates whose output terminals are connected to the clear terminals of said plurality of flip flops;

a load signal input terminal connected to a first input terminal of each of said plurality of AND gates;

a plurality of data input terminals connected to a second input terminal of each of said AND gates, respectively; and a detection circuit for detecting that values held by said plurality of flip flops become all zero and outputting a detection signal.

* * * * *